US010790330B2

(12) United States Patent
Lee et al.

(10) Patent No.: US 10,790,330 B2
(45) Date of Patent: Sep. 29, 2020

(54) SEMICONDUCTOR DEVICE AND DISPLAY DEVICE COMPRISING SAME

(71) Applicant: LG INNOTEK CO., LTD., Seoul (KR)

(72) Inventors: Sang Youl Lee, Seoul (KR); Chung Song Kim, Seoul (KR); Ji Hyung Moon, Seoul (KR); Sun Woo Park, Seoul (KR); Hyeon Min Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/463,730

(22) PCT Filed: Nov. 24, 2017

(86) PCT No.: PCT/KR2017/013560
§ 371 (c)(1),
(2) Date: May 23, 2019

(87) PCT Pub. No.: WO2018/097667
PCT Pub. Date: May 31, 2018

(65) Prior Publication Data
US 2019/0378873 A1 Dec. 12, 2019

(30) Foreign Application Priority Data

Nov. 24, 2016 (KR) .................. 10-2016-0157703
Nov. 29, 2016 (KR) .................. 10-2016-0160753

(51) Int. Cl.
*H01L 27/15* (2006.01)
*H01L 25/065* (2006.01)
(Continued)

(52) U.S. Cl.
CPC .......... *H01L 27/15* (2013.01); *H01L 25/0655* (2013.01); *H01L 33/50* (2013.01); *H01L 33/58* (2013.01); *H01L 33/62* (2013.01)

(58) Field of Classification Search
CPC ..... H01L 27/15; H01L 25/0655; H01L 33/02; H01L 33/38; H01L 33/40; H01L 33/50; H01L 33/58; H01L 33/62; H05B 33/14
See application file for complete search history.

(56) References Cited

U.S. PATENT DOCUMENTS

2001/0026127 A1* 10/2001 Yoneda ............ H01J 1/74
313/506
2008/0001528 A1 1/2008 Eida
(Continued)

FOREIGN PATENT DOCUMENTS

KR 10-2009-0024191 3/2009
KR 10-2013-0007037 1/2013
(Continued)

OTHER PUBLICATIONS

International Search Report (with English Translation) and Written Opinion dated Mar. 2, 2018 issued in Application No. PCT/KR2017/013560.
(Continued)

*Primary Examiner* — Victor A Mandala
(74) *Attorney, Agent, or Firm* — Ked & Associates, LLP

(57) ABSTRACT

One embodiment discloses a semiconductor device comprising: a plurality of light-emitting units; a plurality of wavelength conversion layers each disposed on the plurality of light-emitting units; partitions disposed between the plurality of light-emitting units and between the plurality of wavelength conversion layers; a plurality of color filters each disposed on the plurality of wavelength conversion layers; and black matrix disposed between the plurality of color filters.

20 Claims, 18 Drawing Sheets

(51) Int. Cl.
*H01L 33/50* (2010.01)
*H01L 33/58* (2010.01)
*H01L 33/62* (2010.01)

(56) References Cited

U.S. PATENT DOCUMENTS

| | | |
|---|---|---|
| 2012/0119237 A1 | 5/2012 | Leatherdale et al. |
| 2014/0084784 A1 | 3/2014 | Lee et al. |
| 2014/0168572 A1 | 6/2014 | Iwata et al. |
| 2015/0076529 A1 | 3/2015 | Wang et al. |
| 2015/0228865 A1* | 8/2015 | Rhee .................. H01L 33/0025 257/90 |
| 2015/0362165 A1* | 12/2015 | Chu ...................... H01L 33/32 362/235 |
| 2016/0056194 A1 | 2/2016 | Rudmann et al. |
| 2017/0309798 A1 | 10/2017 | Bonar et al. |
| 2017/0345802 A1* | 11/2017 | Sung ...................... H01L 33/38 |
| 2019/0304346 A1* | 10/2019 | Choi ........................ G09F 9/33 |

FOREIGN PATENT DOCUMENTS

| | | |
|---|---|---|
| KR | 10-2014-0039606 | 4/2014 |
| WO | WO 2016/028227 | 2/2016 |
| WO | WO 2016/079505 | 5/2016 |

OTHER PUBLICATIONS

European Search Report dated May 29, 2020 issued in EP Application No. 17872964.6.

\* cited by examiner

SEMICONDUCTOR DEVICE AND DISPLAY DEVICE COMPRISING SAME

CROSS-REFERENCE TO RELATED PATENT APPLICATIONS

This application is a U.S. National Stage Application under 35 U.S.C. § 371 of PCT Application No. PCT/KR2017/013560, filed Nov. 24, 2017, which claims priority to Korean Patent Application No. 10-2016-0157703, filed Nov. 24, 2016, and Korean Patent Application No. 10-2016-0160753, filed Nov. 29, 2016, whose entire disclosures are hereby incorporated by reference.

TECHNICAL FIELD

Embodiments relate to a semiconductor device and a display device including the same.

BACKGROUND ART

A light-emitting diode (LED) is one of light-emitting devices that emit light when current is applied. The LED may emit high-efficiency light at a low voltage and thus has an excellent energy saving effect. Recently, since the luminance problem of the LED has been significantly improved, LEDs are being applied to various devices such as backlight units of liquid crystal display devices, electric signboards, indicators, and home appliances.

A typical liquid crystal display device controls light emitted from a light-emitting diode and the transmittance of a liquid crystal to display images or pictures with light passing through a color filter. Recently, although there has been a need for a display device having high definition and a large-screen, liquid crystal display devices and organic light-emitting display devices, which have complex configurations and are most commonly used, have difficulty in realizing high-definition, large-screen display devices due to yield and cost.

DISCLOSURE

Technical Problem

Embodiments provide a semiconductor device with improved color purity.

Also, embodiments provide a semiconductor device with improved luminous intensity.

In the embodiments, a chip level light-emitting device including individually driven first to third light-emitting parts may be provided as a pixel of a display device. Here, the first to third light-emitting parts function as each sub-pixel of the pixel, and thus a large-sized display device of high resolution may be realized.

Problems to be solved in the embodiments are not limited to the above-described problems, and objects and effects which may be grasped from the solution means, and the exemplary embodiments of the problems described below are also included.

Technical Solution

One aspect of the present invention provides a semiconductor device including a plurality of light-emitting parts, a plurality of wavelength conversion layers disposed on the plurality of light-emitting parts, respectively, partitions disposed between the plurality of light-emitting parts and between the plurality of wavelength conversion layers, a plurality of color filters disposed on the plurality of wavelength conversion layers, respectively, and black matrix disposed between the plurality of color filters.

A width between the plurality of wavelength conversion layers may be greater than the maximum width between the plurality of light-emitting parts.

Each of the light-emitting parts may include a first conductive type semiconductor layer, a second conductive type semiconductor layer, and an active layer disposed between the first conductive type semiconductor layer and the second conductive type semiconductor layer.

The first conductive type semiconductor layer of the plurality of light-emitting parts may have a width that narrows toward the wavelength conversion layer.

The second conductive type semiconductor layer of the plurality of light-emitting parts may have a width that increases toward the wavelength conversion layer.

The semiconductor device may include a first bump electrode commonly connected to the plurality of light-emitting parts, a plurality of second bump electrodes electrically connected to the plurality of light-emitting parts, respectively, a first electrode electrically connecting the first conductive type semiconductor layers of the plurality of light-emitting parts to each other, and a first insulating layer covering lower portions of the plurality of light-emitting parts.

The semiconductor device may further include a first insulating layer covering lower portions of the plurality of light-emitting parts.

The first electrode may be electrically connected to the first conductive type semiconductor layer through the first insulating layer.

The first electrode may be electrically connected to the first bump electrode.

The semiconductor device may include a plurality of first bump electrodes electrically connected to the plurality of light-emitting parts, respectively, a second bump electrode commonly connected to the plurality of light-emitting parts, and a second electrode electrically connecting the second conductive type semiconductor layers of the plurality of light-emitting parts to each other.

The second electrode may be electrically connected to the second bump electrode.

The semiconductor device may further include a first insulating layer covering lower portions of the plurality of light-emitting parts.

The semiconductor device may further include a plurality of reflective electrodes passing through the first insulating layer and disposed below the second conductive type semiconductor layers of the plurality of light-emitting parts, respectively, and the second electrode may electrically connect the plurality of reflective electrodes to each other.

A width between the neighboring wavelength conversion layers may be in a range of 30 μm to 50 μm.

The partitions may include reflective particles.

The semiconductor device may further include a color filter layer disposed on the wavelength conversion layer, and the color filter layer may include the plurality of color filters and the black matrix.

A display device according to one embodiment of the present invention may include the semiconductor device.

The display device may include a panel having a plurality of pixel regions defined as regions in which common wirings intersect driving wirings, and the semiconductor device is disposed on each pixel region so that the first, second, and third light-emitting parts may be first, second, and third subpixels emitting light of green, red, and blue wavelength bands, respectively.

Advantageous Effects

In a semiconductor device of the embodiments, color purity can be improved.

In a semiconductor device of the embodiments, relative luminous intensity can be improved.

In a semiconductor device of the embodiments, a chip level light-emitting device including individually driven first to third light-emitting parts can be provided as a pixel of a display device. Here, the first to third light-emitting parts can function as each subpixel of the pixel, and a large-sized display device of a high-resolution can be realized.

Various advantages and effects of the present invention are not limited to the above description and can be more easily understood through the description of specific exemplary embodiments of the present invention.

MODES OF THE INVENTION

The embodiments may be modified in other forms, or several embodiments may be combined with one another, and the scope of the present invention is not limited to each of the embodiments described below.

Even when content described in a specific embodiment is not described in other embodiments, the content may be understood as being related to other embodiments unless described otherwise or the content contradicts a specific embodiment in the other embodiments.

For example, when features of a component A are described in a specific embodiment and features of a component B are described in another embodiment, it should be understood that embodiments in which the component A is combined with the component B fall within the scope and spirit of the present invention even when they are not explicitly described, unless there is an opposite or contradictory explanation.

In the description of the embodiments, when one element is referred to as being "on" or "under" another element, the term "on" or "under" refers to either a direct connection between two elements or an indirect connection between two elements having one or more elements formed therebetween. In addition, when the term "on" or "under" is used, it may refer to a downward direction as well as an upward direction with respect to an element.

Hereinafter, embodiments of the present invention will be described in detail with reference to the accompanying drawings so that those of ordinary skill in the art can easily implement them.

A semiconductor device may include various electronic devices such as a light-emitting device and a light-receiving device, and both the light-emitting device and the light-receiving device may include first conductive type semiconductor layers 110a, 110b, and 110c, active layers 120a, 120b, and 120c, and second conductive type semiconductor layers 130a, 130b, and 130c.

The semiconductor device according to the present embodiment may be a light-emitting device.

The light-emitting device emits light by the recombination of electrons and holes, and the wavelength of the light is determined by an inherent energy band gap of a material. Thus, the light emitted may vary depending on the composition of the material.

Hereinafter, the semiconductor device of the embodiment will be described in detail with reference to the accompanying drawings.

Figure 1:
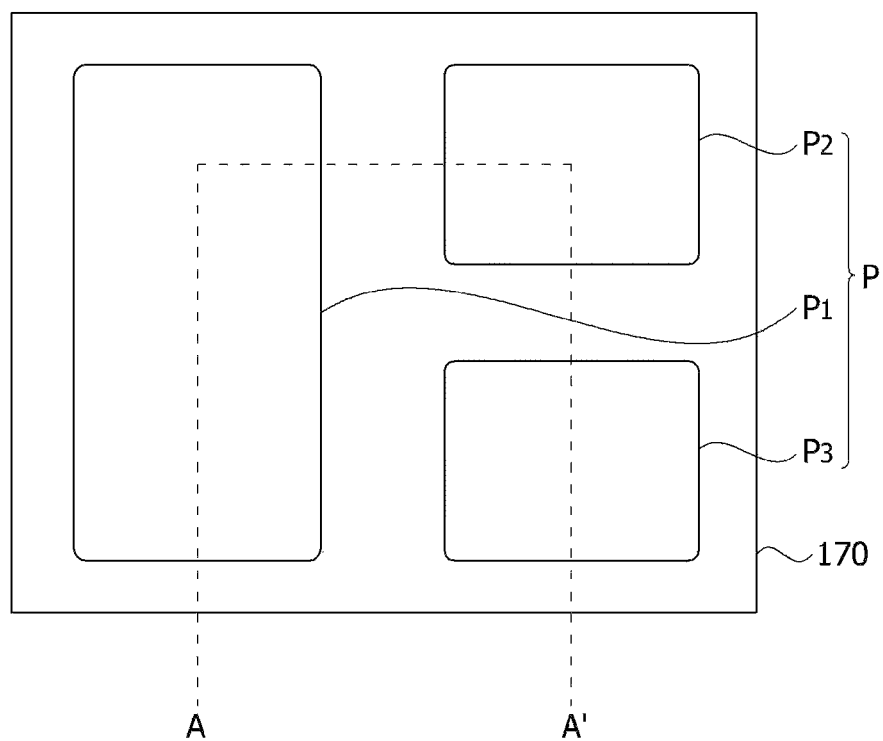
FIG. 1 is a plan view of a semiconductor device according to a first embodiment of the present invention.
Figure 2:
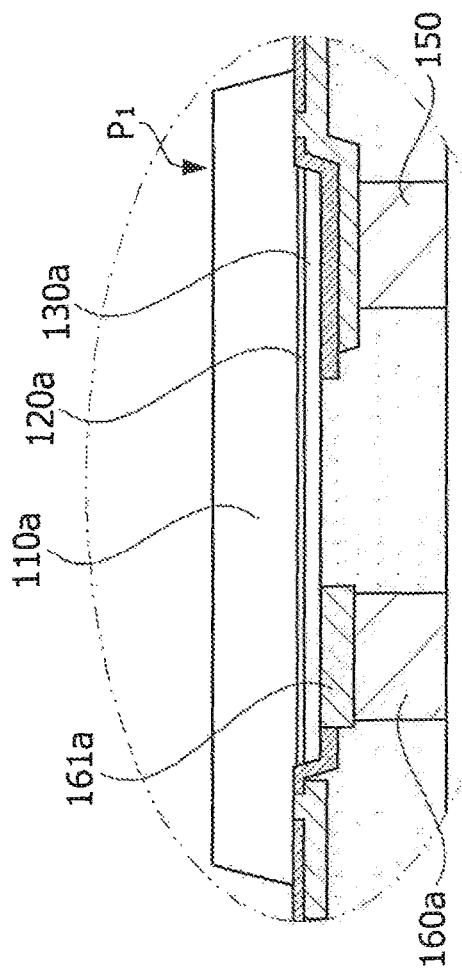
FIG. 2 is a cross-sectional view taken along line A-A in FIG. 1.
Figure 2:
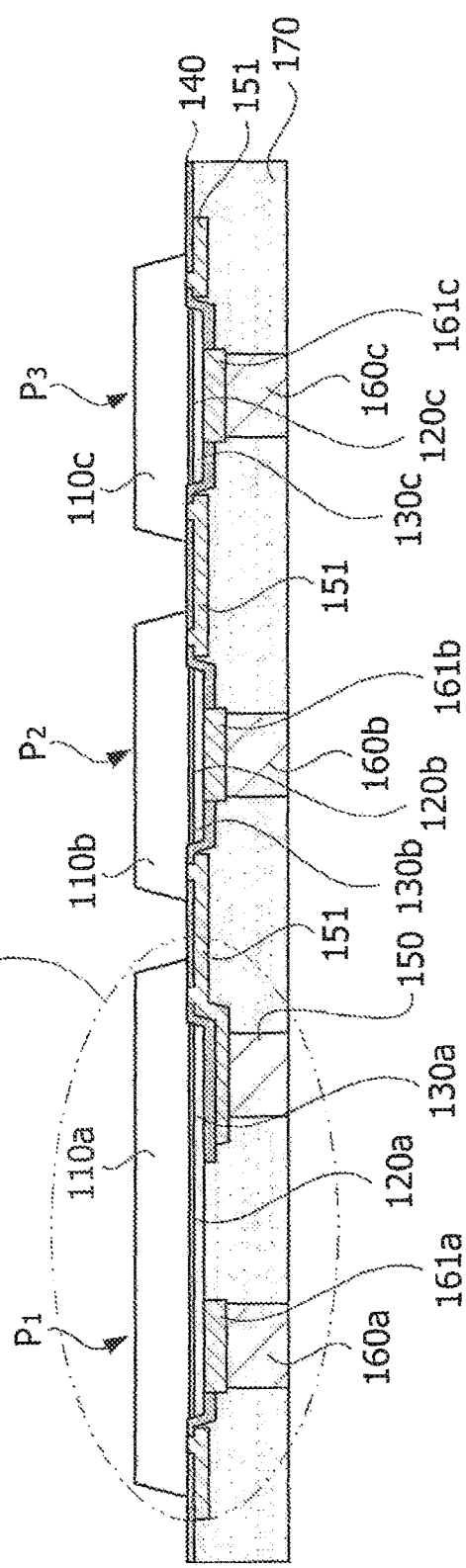

FIG. 1 is a plan view of a semiconductor device according to a first embodiment of the present invention, and FIG. 2 is a cross-sectional view taken along line A-A in FIG. 2.

Referring to FIG. 1, the semiconductor device may include a plurality of light emitting parts P1, P2, and P3. The plurality of light emitting parts P1, P2, and P3 may each emit light of the same wavelength or different wavelengths. The plurality of light emitting parts P1, P2, and P3 may be defined as regions that may be controlled independently from each other. As an example, only one of first to third light-emitting parts P1, P2, and P3 among the plurality of light emitting parts P1, P2, and P3 may be independently turned on by selectively applying current thereto.

The plurality of light emitting parts P1, P2, and P3 may include the first light-emitting part P1 configured to emit light of a first wavelength band, a second light-emitting part P2 configured to emit light of a second wavelength band, and a third light-emitting part P3 configured to emit light of a third wavelength band.

The first light-emitting part P1 may emit green light, and the second light-emitting part P2 and the third light-emitting part P3 may emit blue light, but the present invention is not limited thereto. As an example, the first light-emitting part P1 may emit blue light, and the second light-emitting part P2 and the third light-emitting part P3 may emit green light.

Also, all of the first to third light-emitting parts P1, P2, and P3 may emit blue light. The first to third light-emitting parts P1, P2, and P3 may each emit light having wavelength bands different from each other according to an applied current.

Referring to FIG. 2, a semiconductor device 1A may include the first to third light-emitting parts P1, P2, and P3, a first electrode 151 electrically connecting separated first conductive type semiconductor layers 110a, 110b, and 110c, a first bump electrode 150 connected to the first electrode 151, and a plurality of second bump electrodes 160a, 160b, and 160c electrically connected to separated second conductive type semiconductor layers 130a, 130b, and 130c, respectively.

The first bump electrode 150 and the second bump electrodes 160a, 160b, and 160c of the semiconductor device may be disposed below the plurality of light emitting parts P1, P2, and P3. Although the first bump electrode 150 and the second bump electrodes 160a, 160b, and 160c are illustrated as being disposed below the second conductive type semiconductor layers 130a, 130b, and 130c in the drawing, the present invention is not necessarily limited thereto. As an example, the first bump electrode 150 and the second bump electrodes 160a, 160b, and 160c may be disposed above the first conductive type semiconductor layers 110a, 110b, and 110c.

The first to third light-emitting parts P1, P2, and P3 may include the first conductive type semiconductor layers 110a, 110b, and 110c, the active layers 120a, 120b, and 120c, and the second conductive type semiconductor layers 130a, 130b, and 130c, respectively.

As an example, the first light-emitting part P1 may include the first conductive type semiconductor layer 110a, the active layer 120a, and the second conductive type semiconductor layer 130a, the second light-emitting part P2 may include the first conductive type semiconductor layer 110b, the active layer 120b, and the second conductive type semiconductor layer 130b, and the third light-emitting part P3 may include the first conductive type semiconductor layer 110c, the active layer 120c, and the second conductive type semiconductor layer 130c.

The first conductive type semiconductor layers 110a, 110b, and 110c of the first to third light-emitting parts P1, P2, and P3 may be disposed to have a narrower width in an upward direction, and the second conductive type semiconductor layers 130a, 130b, and 130c of the first to third light-emitting parts P1, P2, and P3 may be disposed to have a narrower width in a downward direction. That is, the first conductive type semiconductor layers 110a, 110b, and 110c and the second conductive type semiconductor layers 130a, 130b, and 130c may be formed to have narrower widths in directions opposite to each other.

The first conductive type semiconductor layers 110a, 110b, and 110c may be formed of compound semiconductors such as Group III-V and Group II-VI, and may be doped with an n-type dopant. The first conductive type semiconductor layers 110a, 110b, and 110c may be formed of a semiconductor material having a composition formula of $In_xAl_yGa_{1-x-y}N$ ($0 \leq x \leq 1$, $0 \leq y \leq 1$, and $0 \leq x+y \leq 1$) or a semiconductor material having a composition formula of $In_xAl_yGa_{1-x-y}P$ ($0 \leq x \leq 1$, $0 \leq y \leq 1$, and $0 \leq x+y \leq 1$). For example, the first conductive type semiconductor layers 110a, 110b, and 110c may be formed of a material selected from AlInN, AlGaAs, GaP, GaAs, GaAsP, and AlGaInP, but the present invention is not limited thereto. The n-type dopant may be selected from Si, Ge, Sn, Se, Te, and the like, but the present invention is not limited thereto.

The active layers 120a, 120b, and 120c may have one structure of, but not limited to, a single well structure, a multi-well structure, a single quantum well structure, a multi-quantum well (MQW) structure, a quantum dot structure, and a quantum wire structure. When the active layers 120a, 120b, and 120c are formed in a well structure, for example, the active layers 120a, 120b, and 120c may have a single well or a quantum well structure including a well layer having a composition formula of $In_xAl_yGa_{1-x-y}N$ ($0 \leq x \leq 1$, $0 \leq y \leq 1$, and $0 \leq x+y \leq 1$) and a blocking layer having a composition formula of $In_aAl_bGa_{1-a-b}N$ ($0 \leq a \leq 1$, and $0 \leq b \leq 1$, $0 \leq a+b \leq 1$).

Further, the active layers 120a, 120b, and 120c may include a well layer having a composition of an $(Al_pGa_{1-p})_qIn_{1-q}P$ layer (wherein, $0 \leq p \leq 1$ and $0 \leq q \leq 1$) and a blocking layer having a composition of an $(Al_{p1}Ga_{1-p1})_{q1}In_{1-q1}P$ layer (wherein, $0 \leq p1 \leq 1$ and $0 \leq q1 \leq 1$), but the present invention is not limited thereto. For example, the active layers 120a, 120b, and 120c may be formed of one or more pairs of InGaN/GaN, InGaN/InGaN, GaN/AlGaN, InAlGaN/GaN, GaAs (InGaAs)/AlGaAs, and GaP(InGaP)/AlGaP, but the present invention is not limited thereto. The well layer may be formed of a material having a band gap smaller than a band gap of the blocking layer.

The active layers 120a, 120b, and 120c are layers in which electrons (or holes) injected through the first conductive type semiconductor layers 110a, 110b, and 110c and holes (or electrons) injected through the second conductive type semiconductor layers 130a, 130b, and 130c meet. The active layers 120a, 120b, and 120c transition to a low energy level as the electrons and the holes are recombined, and may generate light having a wavelength corresponding thereto. For example, the active layers 120a, 120b, and 120c of the first, second, and third light-emitting parts P1, P2, and P3 may generate light of a blue wavelength band.

The second conductive type semiconductor layers 130a, 130b, and 130c may be formed of compound semiconductors such as Group III-V and Group II-VI, and may be doped with a p-type dopant. The second conductive type semiconductor layers 130a, 130b, and 130c may be formed of a semiconductor material having a composition formula of $In_xAl_yGa_{1-x-y}N$ ($0 \leq x \leq 1$, $0 \leq y \leq 1$, and $0 \leq x+y \leq 1$) or a semiconductor material having a composition formula of $In_xAl_yGa_{1-x-y}P$ ($0 \leq x \leq 1$, $0 \leq y \leq 1$, and $0 \leq x+y \leq 1$). For example, the second conductive type semiconductor layers 130a, 130b, and 130c may be formed of a material selected from AlInN, AlGaAs, GaP, GaAs, GaAsP, and AlGaInP. The p-type dopant may be selected from Mg, Zn, Ca, Sr, Ba, and the like, but the present invention is not limited thereto.

The first to third light-emitting parts P1, P2, and P3 may emit light of a blue wavelength band through the first conductive type semiconductor layers 110a, 110b, and 110c.

A first insulating layer 140 may be disposed below the first to third light-emitting parts P1, P2, and P3. The first insulating layer 140 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but the present invention is not limited thereto. The first insulating layer 140 may electrically insulate the first electrode 151 from the second conductive type semiconductor layers 130a, 130b, and 130c and the active layers 120a, 120b, and 120c.

The first insulating layer 140 may be a distributed Bragg reflector (DBR) having a multi-layer structure including a Si oxide or a Ti compound. However, the present invention is not necessarily limited thereto, and the first insulating layer 140 may include various reflection structures.

The first electrode 151 may be disposed between the separated first conductive type semiconductor layers 110a, 110b, and 110c. Further, the first electrode 151 may electrically connect the separated first conductive type semiconductor layers 110a, 110b, and 110c to each other. For example, the first electrode 151 may be electrically connected to the first conductive type semiconductor layers 110a, 110b, and 110c through the first insulating layer 140.

The first electrode 151 may be disposed to be spaced apart from the second bump electrodes 160a, 160b, and 160c. In addition, the first electrode 151 may electrically connect the first conductive type semiconductor layers 110a, 110b, and 110c of each light-emitting structure to each other. The first electrode 151 may be disposed to partially overlap the first conductive type semiconductor layers 110a, 110b, and 110c and electrically connected thereto. The first electrode 151 may be an ohmic electrode, but the present invention is not limited thereto The first bump electrode 150 may be electrically connected to the first electrode 151. Accordingly, the first conductive type semiconductor layers 110a, 110b, and 110c disposed to be spaced apart from each other may be electrically connected to the first bump electrode 150. The first bump electrode 150 and the first electrode 151 may serve as a common electrode, but the present invention is not limited thereto.

The plurality of second bump electrodes 160a, 160b, and 160c may be electrically connected to the second conductive type semiconductor layers 130a, 130b, and 130c. As an example, a second-first bump electrode 160a may be electrically connected to a second-first conductive type semiconductor layer 130a, and a second-second bump electrode 160b may be electrically connected to a second-second conductive type semiconductor layer 130b, and a second-third bump electrode 160c may be electrically connected to a second-third conductive type semiconductor layer 130c.

The first bump electrode 150 and the second bump electrodes 160a, 160b, and 160c may be formed of a metal such as Ag, Ni, Al, Rh, Pd, Ir, Ru, Mg, Zn, Pt, Au, Hf, and Cu. Further, the first bump electrode 150 and the second bump electrodes 160a, 160b, and 160c may be formed of one or a plurality of layers in which a conductive oxide film and a metal are mixed, but the present invention is not limited thereto.

A reflective layer may be further disposed below the second conductive type semiconductor layers 130a, 130b, and 130c, but the present invention is not limited thereto.

Second electrodes 161a, 161b, and 161c may be disposed between the plurality of second bump electrodes 160a, 160b, and 160c and the second conductive type semiconductor layers 130a, 130b, and 130c, respectively. However, the present invention is not necessarily limited thereto, and the second bump electrodes 160a, 160b, and 160c may include materials which are in ohmic contact with the second conductive type semiconductor layers 130a, 130b, and 130c

A support layer 170 may be disposed below the semiconductor device to support the insulating layer 140, the first electrode 151, the first conductive type semiconductor layers 110a, 110b, and 110c, the active layers 120a, 120b, and 120c, and the second conductive type semiconductor layers 130a, 130b, and 130c. Further, the support layer 170 has low light transmittance and may function as a light reflective layer and/or a light absorption layer.

The support layer 170 may have a structure in which reflective particles are dispersed in a base material. The base material may be at least one of an epoxy resin, a silicone resin, a polyimide resin, a urea resin, and an acrylic resin. As an example, a polymer resin may be a silicone resin. The reflective particles may include inorganic particles such as $TiO_2$ or $SiO_2$. However, the present invention is not necessarily limited thereto, and the support layer may be an epoxy molding compound (EMC) resin or a silicone molding compound (SMC) resin.

The support layer 170 may include 10 to 50 wt %, or 15 to 30 wt % of inorganic particles. When the content of the particles is less than 10 wt %, it is difficult to control the transmittance to 20% or less, and when the content is greater than 50 wt %, the content of the inorganic particles is great and thus cracks may occur.

The support layer 170 may have a thermal expansion coefficient (CTE) of 50 ppm/° C. or less. When the thickness of the support layer 170 is 70 μm or more, the transmittance of the support layer 170 may be 20% or less. As a result, the light generated in the first to third light-emitting parts P1, P2, and P3 may be reflected at the support layer 170 toward upper portions of the first conductive type semiconductor layers 110a, 110b, and 110c. Thus, the semiconductor device according to the embodiment may provide improved light emission efficiency.

Figure 3:
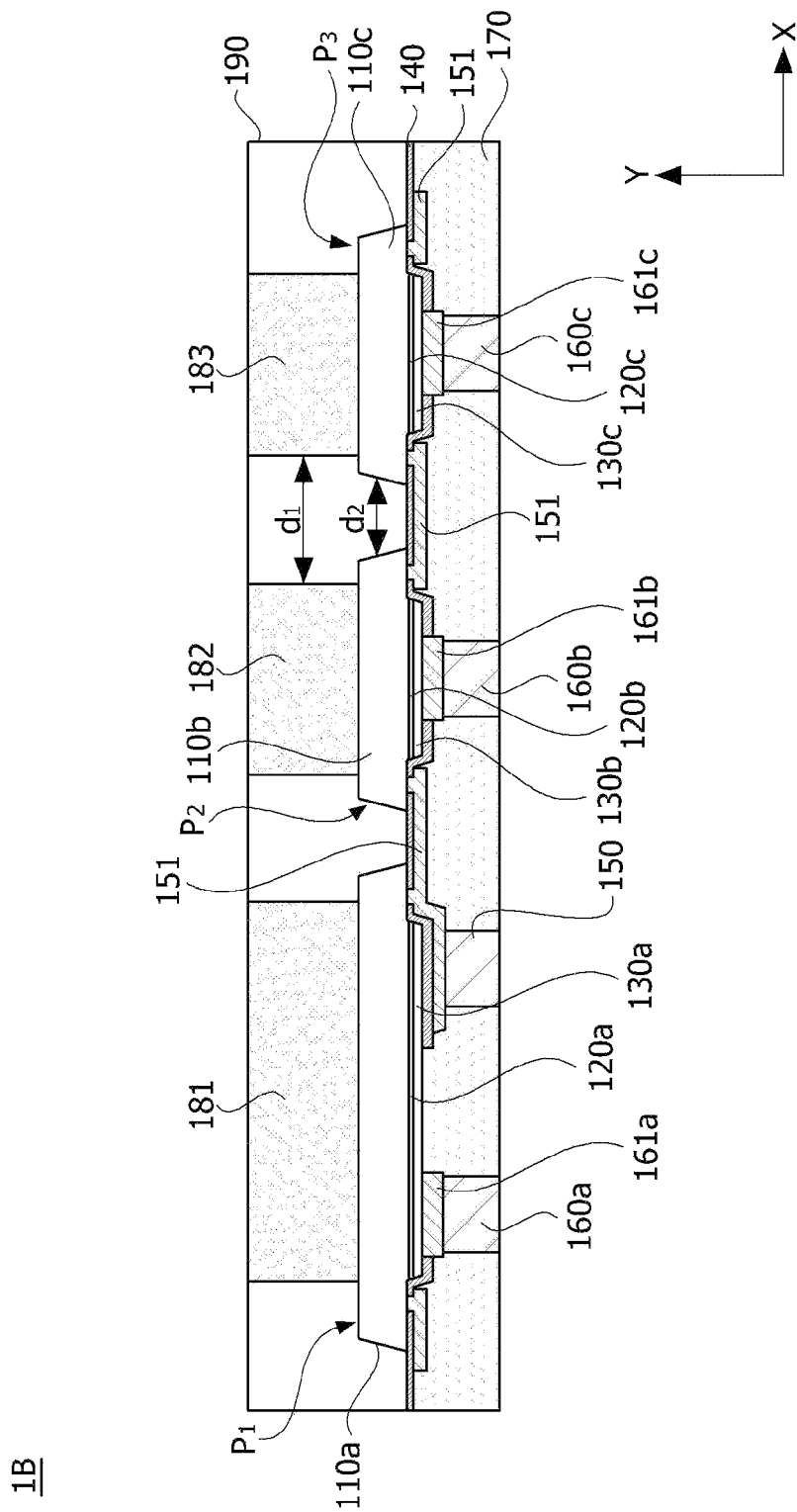
FIG. 3 is a cross-sectional view of a semiconductor device according to a second embodiment of the present invention.
Figure 4A:
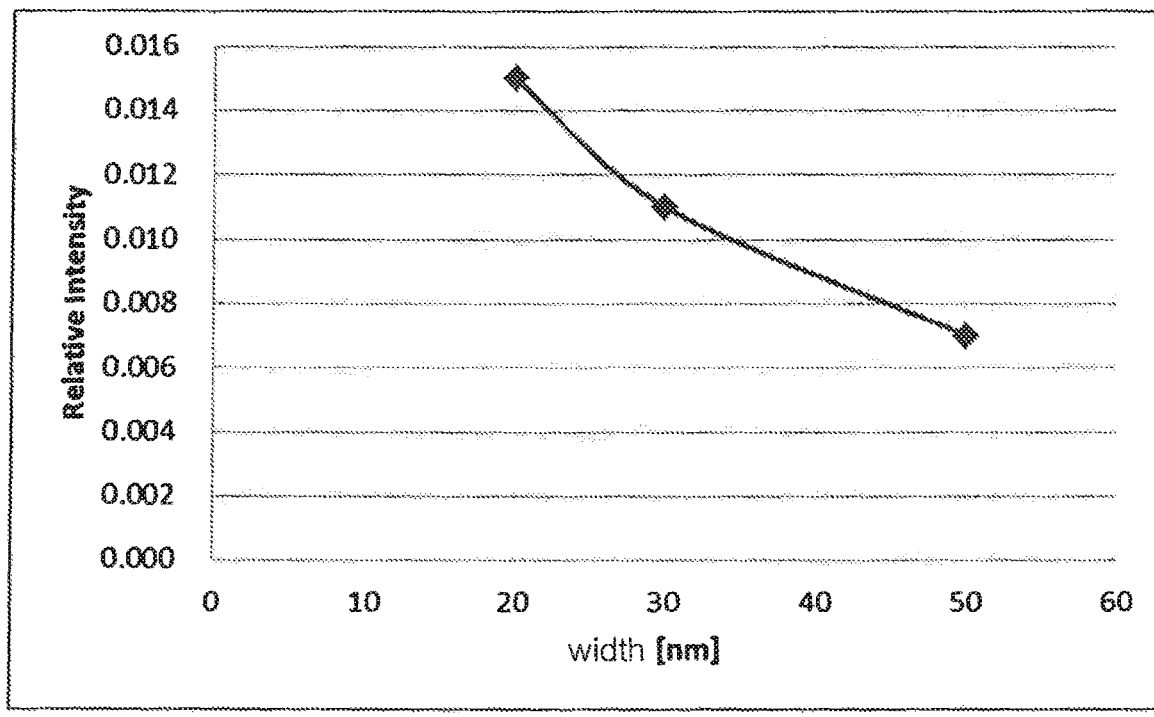
FIGS. 4A and 4B are graphs illustrating changes in luminous flux and color purity according to the width of a partition of the semiconductor device according to the embodiments.
Figure 4B:
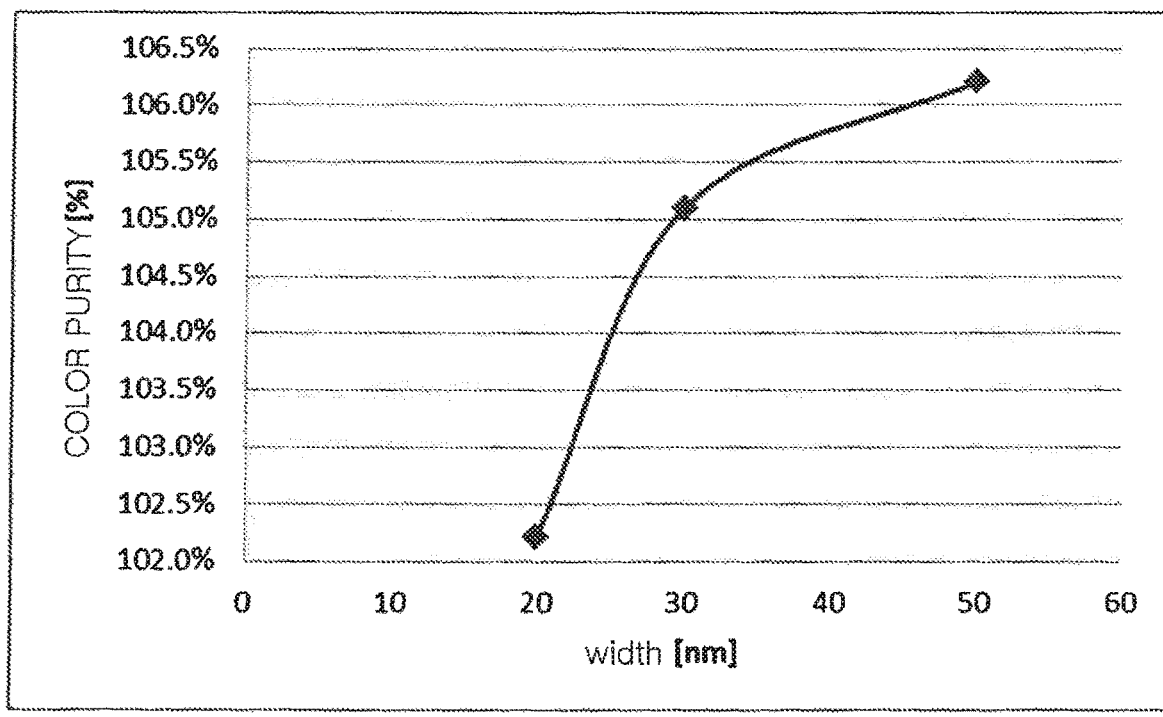

FIG. 3 is a cross-sectional view of a semiconductor device according to a second embodiment of the present invention, and FIGS. 4A and 4B are graphs illustrating changes in luminous flux and color purity according to the width of a partition of the semiconductor device according to the embodiments.

Referring to FIG. 3, a semiconductor device 1B according to the second embodiment may further include wavelength conversion layers 181, 182, and 183 and partitions 190 disposed on first to third light-emitting parts P1, P2, and P3.

The wavelength conversion layers 181, 182, and 183 may convert wavelengths of light emitted from the first to third light-emitting parts P1, P2, and P3.

As an example, a first wavelength conversion layer 181 may convert light emitted from the first light-emitting part P1 into green light, a second wavelength conversion layer 182 may convert light emitted from the second light-emitting part P2 into red light, and a third wavelength conversion layer 183 may convert light emitted from the third light-emitting part P3 into blue light. When the third light-emitting part P3 emits the blue light, the third wavelength conversion layer 183 may not change the wavelength or may not be disposed.

However, the present invention is not necessarily limited thereto, and the first to third wavelength conversion layers 181, 182, and 183 may absorb light of a blue (B) wavelength band emitted from the first to third light-emitting parts P1, P2, and P3 and convert the light into light of a white (W) wavelength band.

The wavelength conversion layers 181, 182, and 183 may have a structure in which wavelength conversion particles are dispersed in a polymer resin selected from an epoxy resin, a silicone resin, a polyimide resin, a urea resin, an acrylic resin, and the like, but the present invention is not limited thereto.

The wavelength conversion particles may include at least one of a phosphor and a quantum dot (QD). Hereinafter, the wavelength conversion particles will be described as a phosphor.

The phosphor may include one fluorescent material among a YAG-based fluorescent material, a TAG-based fluorescent material, a silicate-based fluorescent material, a sulfide-based fluorescent material, and a nitride-based fluorescent material, but the embodiment is not limited to the type of the phosphor.

As an example, the YAG-based and TAG-based fluorescent materials may be selected from among (Y, Tb, Lu, Sc, La, Gd, Sm)3(Al, Ga, In, Si, Fe)5(O, S)12:Ce, and the silicate-based fluorescent material may be selected from among (Sr, Ba, Ca, Mg)2SiO4:(Eu, F, Cl). In addition, the sulfide-based fluorescent material may be selected from among (Ca, Sr)S:Eu and (Sr,Ca,Ba)(Al,Ga)2S4:Eu, and the nitride-based phosphor may be (Sr, Ca, Si, Al, O)N:Eu (for example, CaAlSiN4:Eu SiAlON:Eu) or (Ca$x$,M$y$)(Si,Al)12 (O,N)16 which is a Ca-α SiAlON:Eu-based phosphor. In this case, M is at least one material among Eu, Tb, Yb, and Er, and may be selected from among phosphor components satisfying 0.05<(x+y)<0.3, 0.02<x<0.27, and 0.03<y<0.3.

The wavelength conversion layers 181, 182, and 183 described above may be separated into regions overlapping the first to third light-emitting parts P1, P2, and P3 in a vertical direction by the partitions 190. The partitions 190 may be disposed between the wavelength conversion layers 181, 182, and 183 and between the light-emitting parts P1, P2, and P3. The partition 190 may include a light absorbing material such as carbon black or graphite, but may also include a reflective material that reflects the light.

The partition 190 may have a structure in which reflective particles are dispersed in a base material. The base material may be at least one of an epoxy resin, a silicone resin, a polyimide resin, a urea resin, and an acrylic resin. As an example, the polymer resin may be a silicone resin. The reflective particles may include inorganic particles such as TiO2 or SiO2, but the present invention is not limited thereto.

The partition 190 may include 20 wt % or more of the inorganic particles. As an example, the inorganic particles in the partition may be in a range of 20 wt % to 70 wt %. When the inorganic particles are included in an amount of less than 20 wt %, there is a problem in that reflectance of the partition 190 is lowered and thus color purity is lowered. For example, when only the first light-emitting part P1 is turned on to emit green light, a portion of the light emitted from the first light-emitting part P1 may pass through the partition 190 and may be converted into red light by the second wavelength conversion layer 182. As a result, the color purity may be lowered. In the partition 190, when the inorganic particles are more than 70 wt %, the content of the polymer resin becomes small, and thus cracks may occur.

The partition 190 may include a first region disposed between the wavelength conversion layers 181, 182, and 183 and a second region disposed between the first to third light-emitting parts P1, P2, and P3.

As an example, a width d1 of the first region may be greater than a width d2 of the second region. However, the present invention is not necessarily limited thereto, and the width d1 of the first region and the width d2 of the second region may be the same.

The widths d1 and d2 of the first and second regions may be distances in a direction (an X axis direction) perpendicular to a thickness direction of the plurality of light emitting parts P1, P2, and P3.

The width d1 of the first region of the partition 190 may be 10 μm or more. The width d1 of the first region may be in a range of 10 μm to 50 μm. When the width d1 of the first region is 10 μm or more, the partition 190 may block the light emitted from the first to third light-emitting parts P1, P2, and P3 to improve color purity.

As an example, when the content of the inorganic particles is 20 wt % or more and the thickness is 30 μm or more, the partition 190 blocks the light emitted from the first to third light-emitting parts P1, P2, and P3 to prevent color mixing and superposition of the light.

When the width d1 of the first region is greater than 50 μm, widths between first to third light-emitting parts P1, P2, and P3 are widened, and thus the size of the semiconductor device may be increased. The method of forming the partition 190 is not particularly limited. For example, the partition 190 may be formed using photolithography, imprinting, roll-to-roll printing, and ink-jet printing, or the like.

The width d1 of the first region may be greater than the maximum width d2 of the second region. Accordingly, the widths of the first to third wavelength conversion layers 181, 182, and 183 in the X axis direction may be smaller than the widths of the first to third light-emitting parts P1, P2, and P3, respectively. With such a structure, the width d1 of the partition may be increased while manufacturing the semiconductor device to have the same size. As an example, the width of each of the first to third wavelength conversion layers 181, 182, and 183 in the X axis direction may be 80% to 90% of the width of each of the first to third light-emitting parts P1, P2, and P3, respectively.

Referring to FIGS. 4A and 4B, it can be seen that as the width of the first region increases, the luminous flux of the plurality of light-emitting parts decreases slightly, but the color purity is greatly improved. That is, the color purity was improved by 102% when the width of the first region was 20 μm, the color purity was improved by 105% when the width of the first region was 30 μm, and the color purity was improved by 106% when the width of the first region was 50 μm.

Figure 5:
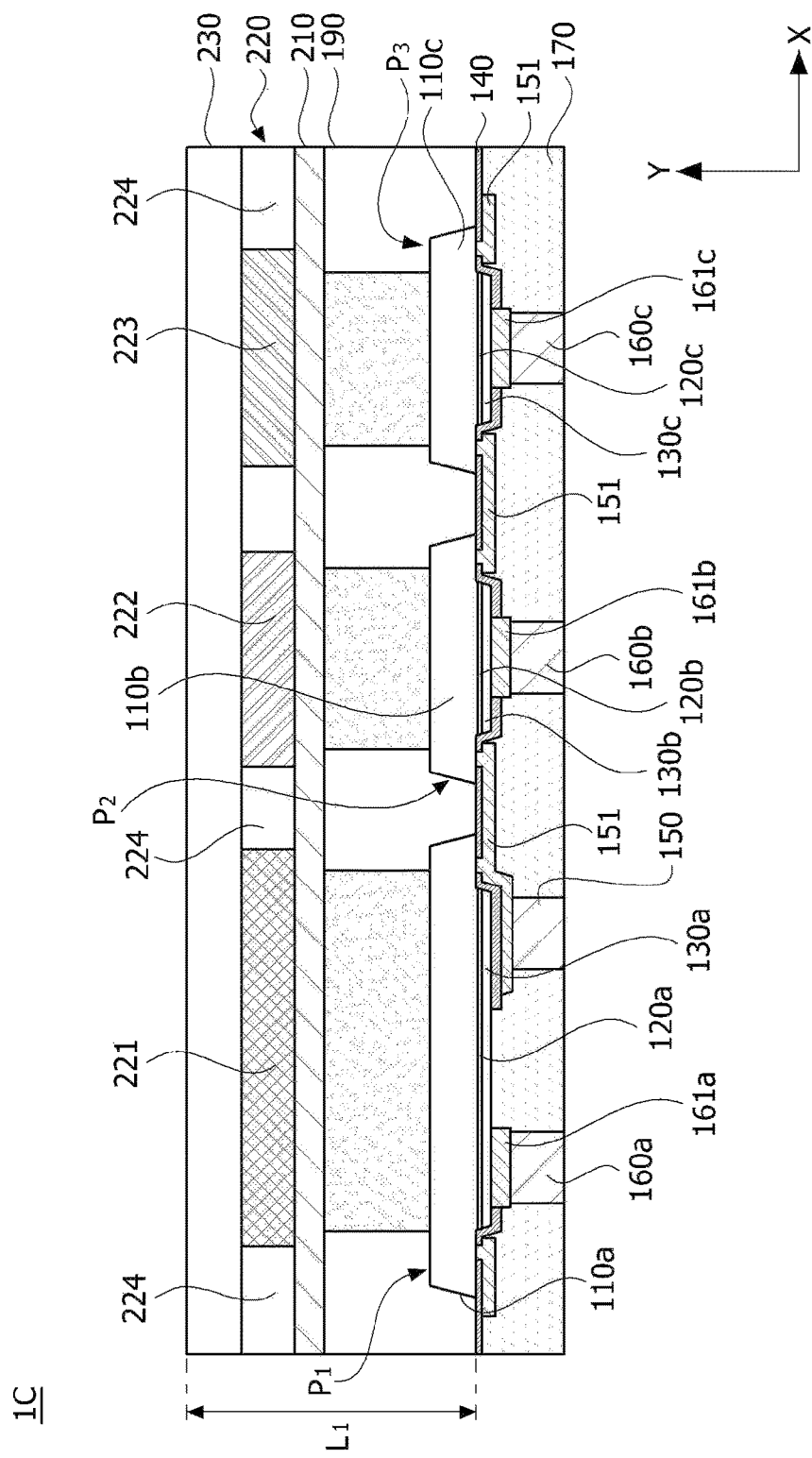
FIG. 5 is a cross-sectional view of a semiconductor device according to a third embodiment of the present invention.
Figure 6:
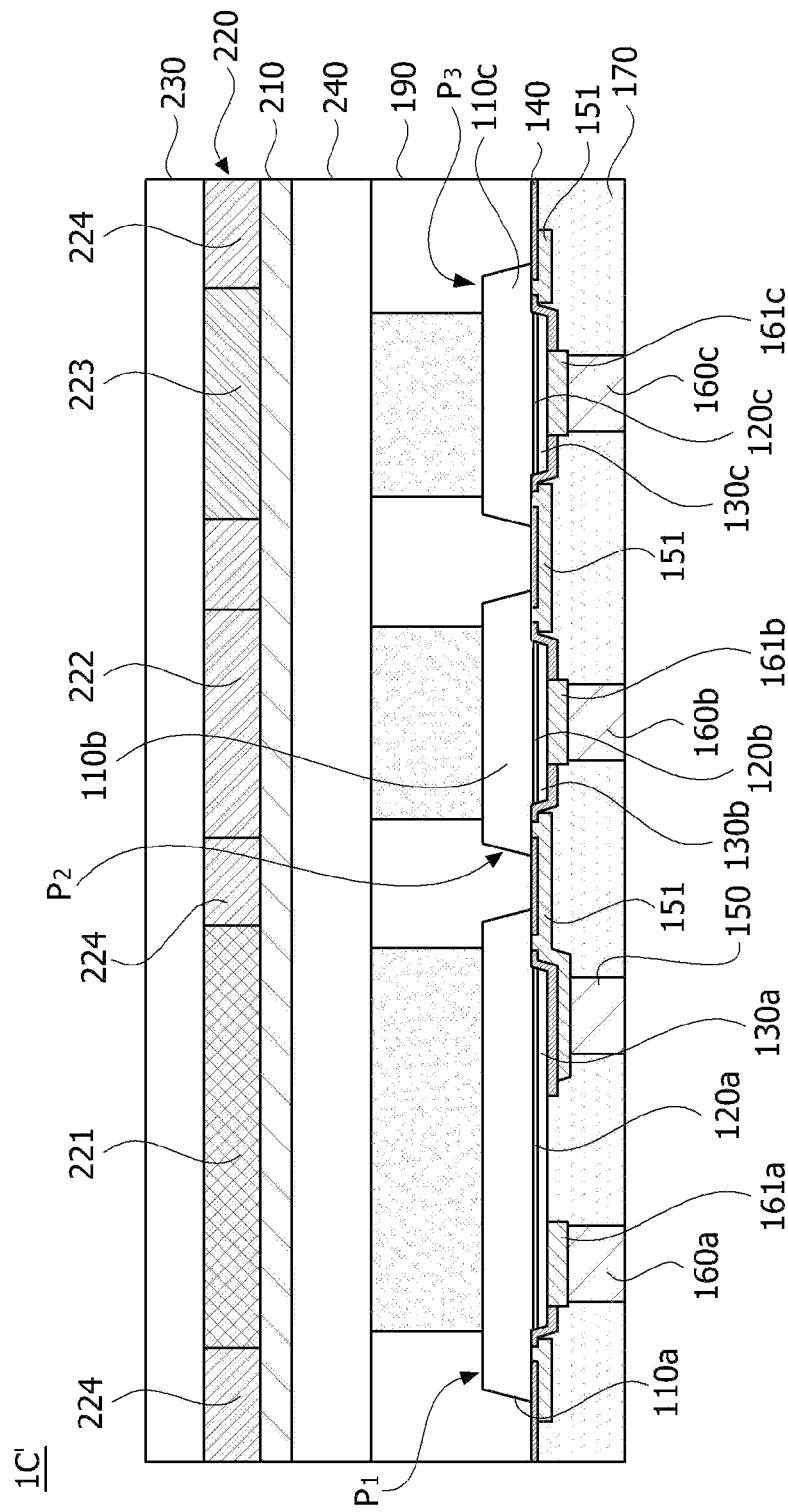
FIG. 6 is a modified example of FIG. 5.

FIG. 5 is a cross-sectional view of a semiconductor device according to a third embodiment of the present invention, and FIG. 6 is a modified example of FIG. 5.

Referring to FIG. 5, a semiconductor device 1C according to the third embodiment may include a color filter layer 220 disposed above wavelength conversion layers 181, 182, and 183 and partitions 190

The color filter layer 220 may include a plurality of color filters 221, 222, and 223 and a black matrix 224. First to third color filters 221, 222, and 223 may be disposed in the color filter layer 220. As an example, the first color filter 221 may be a green filter, the second color filter 222 may be a red filter, and the third color filter 223 may be a blue filter.

The plurality of color filters 221, 222, and 223 may be formed by mixing green/red/blue pigments with an acryl-based resin such as methylmethacrylate-butadiene-styrene (MBS). As an example, the color filter layer 220 may be formed by coating, exposing, developing, and curing (firing) a pigment composition dispersed in a photoresist.

The color filter layer 220 may improve the color purity of light converted by the wavelength conversion layers 181, 182, and 183. As an example, the first color filter 221 may block light other than green light converted by a first wavelength conversion layer 181 to improve the color purity of the green light.

Further, when the wavelength conversion layers 181, 182, and 183 convert light of the first to third light-emitting parts P1, P2, and P3 into white light, the color filter layer 220 may separate light of a white (W) wavelength band into light of blue (B), green (G), and red (R) wavelength bands.

The color filter layer 220 may include the black matrix 224 disposed between the first to third color filters 221, 222, and 223. However, the present invention is not necessarily limited thereto and a structure is not particularly limited as long as it is a structure that may be disposed and partitioned between the first to third color filters 221, 222, and 223.

A thickness of the black matrix 224 may be in a range of 5 μm to 55 μm. When the thickness is smaller than 5 μm, the first to third color filters 221, 222, and 223 may not be partitioned due to a thickness that is too thin, and when the thickness is greater than 55 μm, there is a problem in that the entire thickness of the filter becomes thick. However, the thickness of the black matrix 224 is not necessarily limited thereto.

Further, a width of the black matrix 224 may be in a range of +/−5 μm of a width d1 of a first region of the partition 190 disposed below the black matrix 224. The width of the black matrix 224 may be in a range of 5 μm to 55 μm.

A first intermediate layer 210 may be disposed between the color filter layer 220 and the wavelength conversion layers 181, 182, and 183 to perform the role of adhering them. As described above, the color filters 221, 222, and 223 may use an acrylic resin as a main raw material, and the partitions and the wavelength conversion layers 181, 182, and 183 may use a silicone resin as a main raw material. However, since the acrylic resin and the silicone resin have a poor adhesive property due to differences in physical properties, it may not be easy to form the color filters 221, 222, and 223 directly on the wavelength conversion layers 181, 182, and 183.

The first intermediate layer 210 may include an oxide or a nitride as an inorganic material. As an example, the first intermediate layer 210 may be formed as a single layer or a multilayer including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, ZnO, SiO2, SixOy, Si3N4, SixNy, SiOxNy, Al2O3, TiO2, and AlN. However, the present invention is not necessarily limited thereto, and the material may be selected for the first intermediate layer 210 without limitation as long as it is a material having excellent adhesion to both the acrylic resin and the silicone resin.

A thickness of the first intermediate layer 210 may be in a range of 5 nm to 1,000 nm, or 40 nm to 200 nm. When the thickness is less than 5 nm, it is difficult to prevent the acrylic resin from diffusing into a phosphor, and when the thickness is more than 1000 nm, there is a problem in that transmittance becomes smaller than 70%, leading to a decrease in luminous flux.

A total thickness L1 of the partition 190, the first intermediate layer 210, the color filter layer 220, and an encapsulation layer 230 may be in a range of 30 μm to 100 μm. Here, when the total thickness L1 of the partition 190, the first intermediate layer 210, the color filter layer 220, and the encapsulation layer 230 is less than 30 μm, the number of particles in the wavelength conversion layers 181, 182, and 183 is small, such that color conversion may be reduced and the process may be difficult. In addition, when the total thickness L1 of the partition 190, the first intermediate layer 210, the color filter layer 220, and the encapsulation layer 230 is greater than 100 μm, the light transmittance may be reduced due to the thickness. Here, the thickness denotes a distance in a Y-axis direction.

Referring to FIG. 6, in a semiconductor device 1C' of the modified example, a second intermediate layer 240 may be disposed between a first intermediate layer 210 and wavelength conversion layers 181, 182, and 183. The wavelength conversion layers 181, 182, and 183 may not have a flat surface due to a process or the dispersion of phosphor particles in a resin. Accordingly, when a color filter layer is formed on surfaces of the wavelength conversion layers 181, 182, and 183, there is a problem that reliability is lowered. The first intermediate layer 210 may be disposed on the second intermediate layer 240 to provide the flat surface.

However, the present invention is not necessarily limited thereto, and the configuration of the second intermediate layer 240 may be omitted. As an example, when the surface roughness of the wavelength conversion layers 181, 182, and 183 and partitions 190 is 10 μm or less or 5 μm or less, the second intermediate layer 240 may be omitted. Here, the surface roughness of the first intermediate layer 210 may be determined by the surface roughness of the wavelength conversion layers 181, 182, and 183 and the partitions 190. A leveling or polishing process may be performed to control the surface roughness of the wavelength conversion layers 181, 182, and 183 and the partitions 190.

The second intermediate layer 240 may include the same material as the wavelength conversion layers 181, 182, and 183 for adhesion therewith. As an example, both the second intermediate layer 240 and the wavelength conversion layers 181, 182, and 183 may include a silicone resin.

A thickness of the second intermediate layer 240 may be in a range of 3,000 nm to 20,000 nm. When the thickness of the second intermediate layer 240 is less than 3,000 nm, the surface planarization of the second intermediate layer 240 may be poor, and when the thickness is greater than 20,000 nm, light transmittance is decreased. Thus, a thickness ratio of the first intermediate layer 210 to the second intermediate layer 240 may be in a range of 1:4000 to 1:3.

An encapsulation layer 230 may be disposed on a color filter layer 220. The encapsulation layer 230 may protect a plurality of light emitting parts P1, P2, and P3, the wavelength conversion layers 181, 182, and 183, and the partitions 190 by being disposed on the color filter layer 220 so as to cover pixels and the semiconductor device.

The encapsulation layer 230 is made of a heat- and/or light-curable resin and coated on the color filter layer 220 in a liquid state, and may be cured by a curing process using heat and/or light. Here, the encapsulation layer 230 may also serve to buffer external pressing.

FIGS. 7A to 7F are views illustrating a method of manufacturing the semiconductor device according to the third embodiment.

Figure 7A:
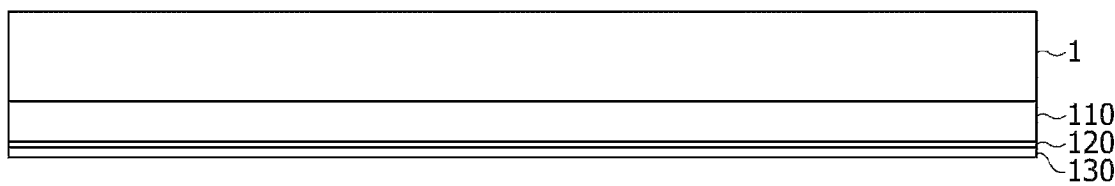
FIGS. 7A to 7F are views illustrating a method of manufacturing the semiconductor device according to the third embodiment.

Referring to FIG. 7A, a first conductive type semiconductor layer 110, an active layer 120, and a second conductive type semiconductor layer 130 may be sequentially formed on a substrate 1. The substrate 1 may be formed of a material selected from the group consisting of sapphire (Al2O3), SiC, GaAs, GaN, ZnO, Si, GaP, InP, and Ge, but the present invention is not limited thereto.

Although not shown in the drawing, a buffer layer (not shown) may be further provided between the first conductive type semiconductor layer 110 and the substrate 1. The buffer layer may mitigate a lattice mismatch between the first conductive type semiconductor layer 110, the active layer 120, and the second conductive type semiconductor layer 130, and the substrate 1. The buffer layer may include a combination of a Group III element and a Group V element or any one selected from the group consisting of GaN, InN, AlN, InGaN, AlGaN, InAlGaN, and AlInN. The buffer layer may be doped with a dopant, but the present invention is not limited thereto.

The first conductive type semiconductor layer 110, the active layer 120, and the second conductive type semiconductor layer 130 may be formed by a method such as a metal organic chemical vapor deposition (MOCVD) method, a chemical vapor deposition (CVD) method, a plasma-enhanced chemical vapor deposition (PECVD) method, a molecular beam epitaxy (MBE) method, a hydride vapor phase epitaxy (HVPE) method, or a sputtering method, but the present invention is not limited thereto.

Figure 7B:
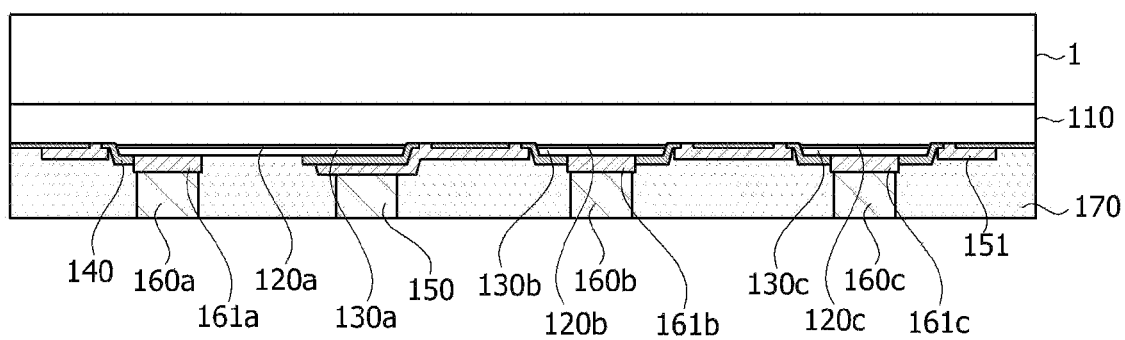

Referring to FIG. 7B, a first insulating layer 140, a first electrode 151, and second electrodes 161a, 161b, and 161c may be formed on the second conductive type semiconductor layer 130. Subsequently, a support layer 170 is formed, and then a first bump electrode 150 and second bump electrodes 160a, 160b, and 160c may be formed to pass through the support layer 170. However, the present invention is not limited thereto, and the first bump electrode 150 and the second bump electrodes 160a, 160b, and 160c may be formed, and then the support layer 170 may be formed.

Here, second conductive type semiconductor layers 130a, 130b, and 130c and active layers 120a, 120b, and 120c may be mesa-etched and separated from each other. Accordingly, the second conductivity type semiconductor layers 130a, 130b, and 130c and the active layers 120a, 120b, and 120c may be formed to narrow in width in a direction away from the substrate 1.

Figure 7C:
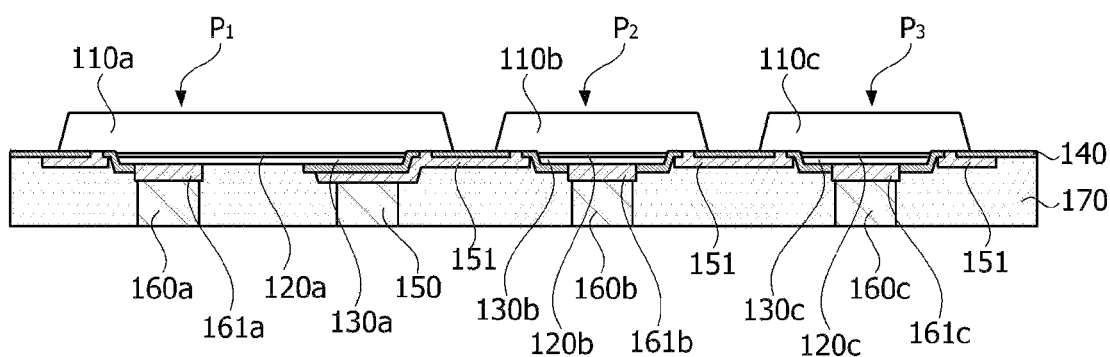

Referring to FIG. 7C, the substrate 1 may be removed. The substrate 1 may be removed using a laser lift off (LLO) method, but the present invention is not limited thereto. Thereafter, the first conductive type semiconductor layer 110 may be separated into each part unit of the light-emitting parts P1, P2, and P3. Accordingly, the first conductive type semiconductor layer 110 may be formed to have a smaller width in a direction opposite to the second conductive type semiconductor layer 130 during a mesa etching process.

Figure 7D:
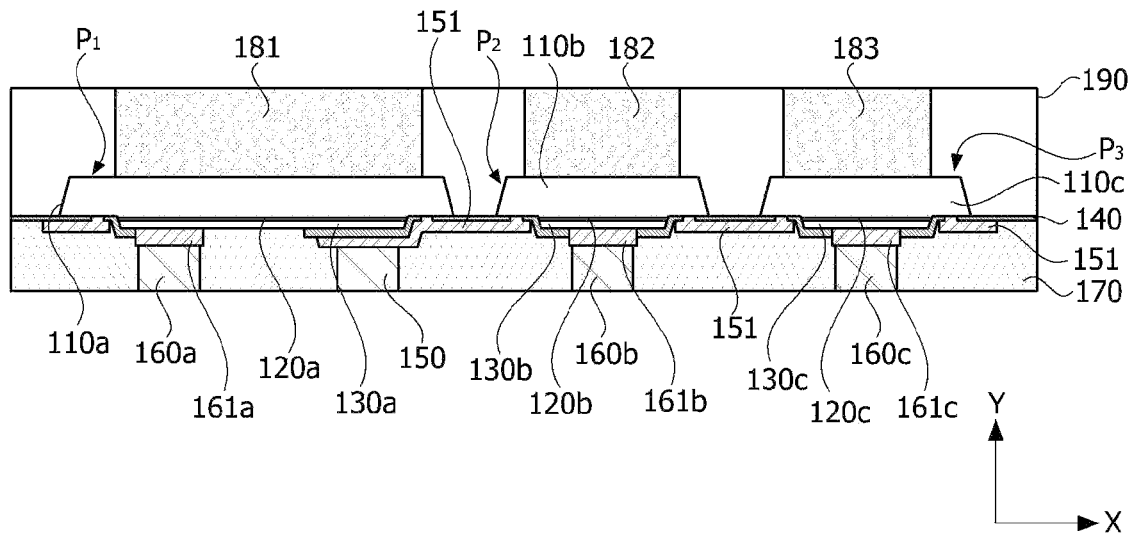

Referring to FIG. 7D, wavelength conversion layers 181, 182, and 183 and partitions 190 may be formed on the first conductive type semiconductor layer 110. Here, the wavelength conversion layers 181, 182, and 183 may be formed first, and then the partitions 190 may be formed, but the present invention is not necessarily limited thereto, and the partitions 190 may be formed first to form through holes, and the wavelength conversion layers 181, 182, and 183 may be formed in the through holes.

Figure 7E:
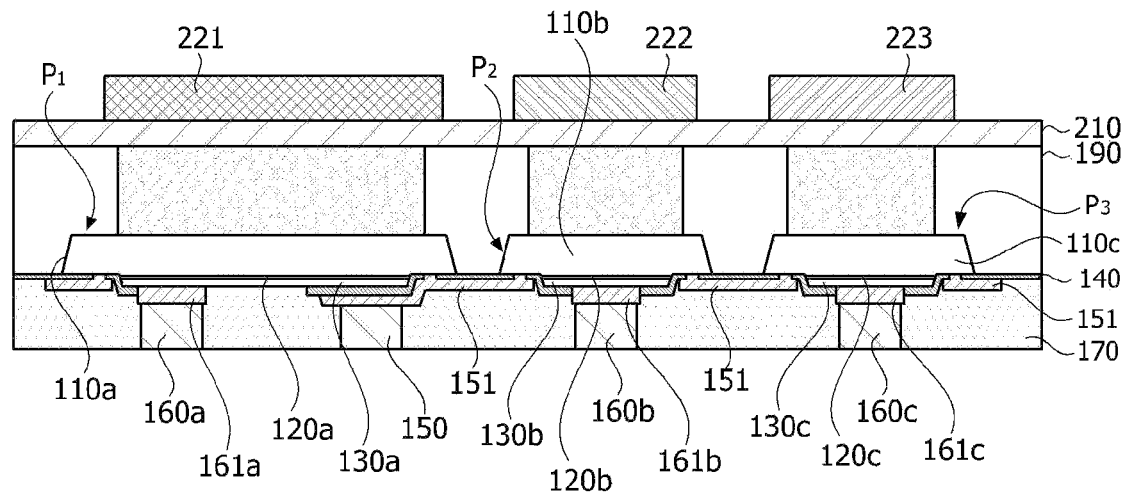

Referring to FIG. 7E, a first intermediate layer 210 may be formed on the wavelength conversion layers 181, 182, and 183, and then first to third color filters 221, 222, and 223 may be formed on the first intermediate layer 210. Here, black matrix may be formed first and aligned with the wavelength conversion layers 181, 182, and 183, and then the first to third color filters 221, 222, and 223 may be formed after, but the present invention is not limited thereto.

Specifically, the first color filter 221 may be formed on a region corresponding to the first wavelength conversion layer 181 by applying a green pigment over the entire surface by a method such as spin coating or bar coating, and performing a mask process.

Thereafter, the second color filter 222 may be formed on a region corresponding to the second wavelength conversion layer 182 by applying a red pigment over the entire surface by a method such as spin coating or bar coating, and performing a mask process.

Figure 7F:
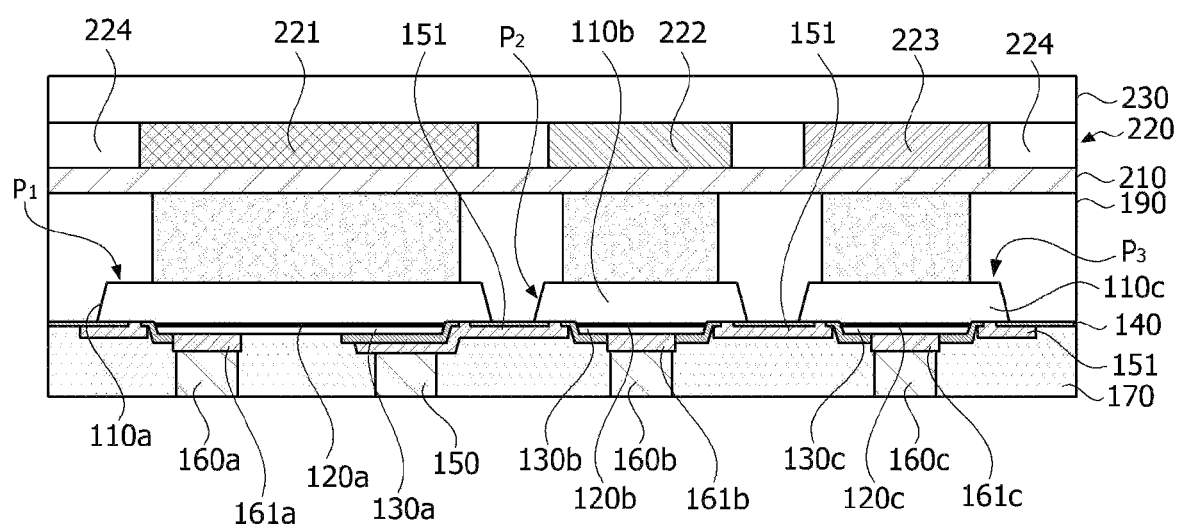

Subsequently, the third color filter 223 may be formed on a region corresponding to the third wavelength conversion layer 183 by applying a blue pigment over the entire surface by a method such as spin coating or bar coating, and performing a mask process. Afterward, an encapsulation layer 230 may be formed on the color filter layer 220 as shown in FIG. 7F.

Figure 8:
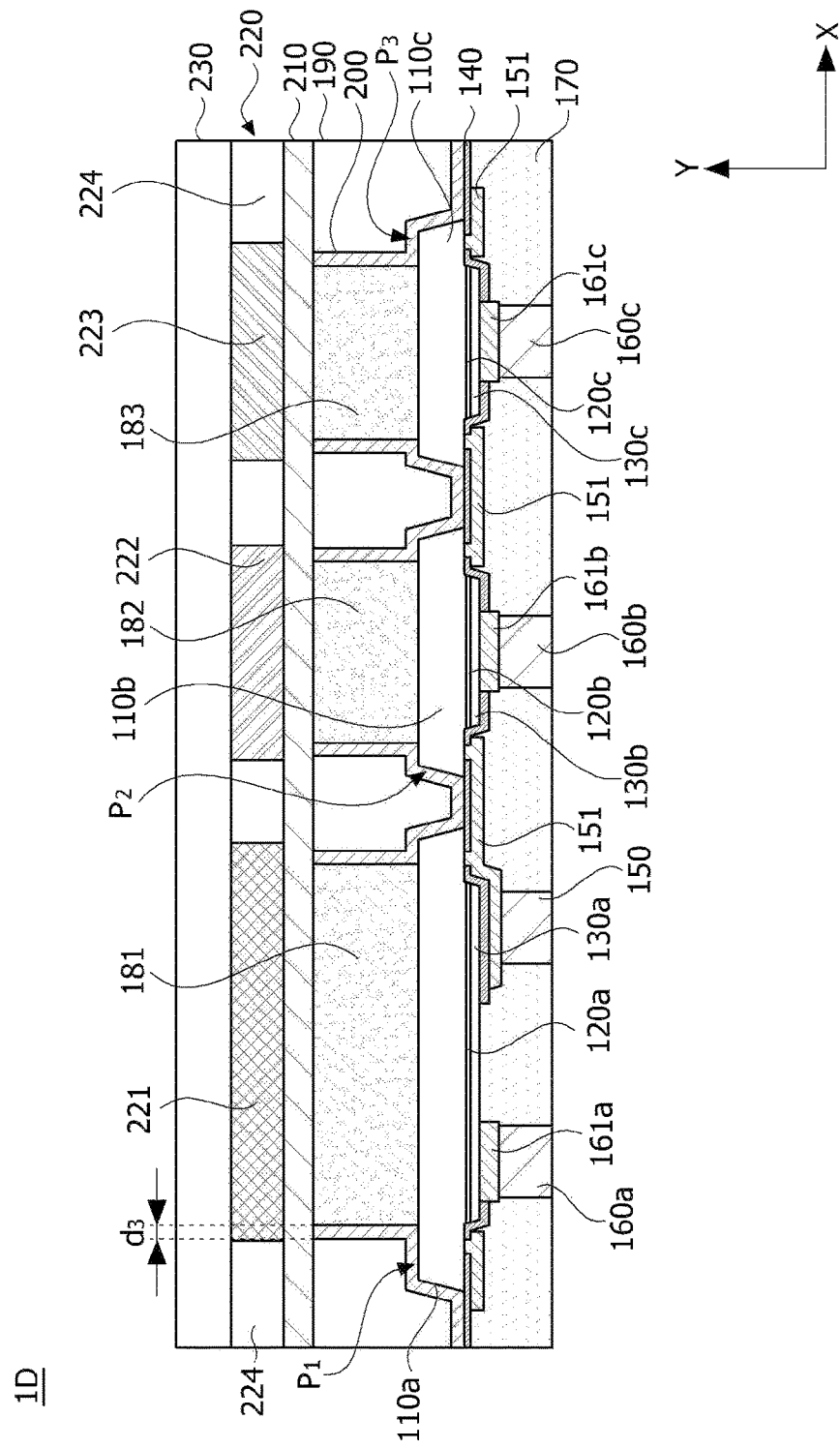
FIG. 8 is a cross-sectional view of a semiconductor device according to a fourth embodiment of the present invention.

FIG. 8 is a cross-sectional view of a semiconductor device according to a fourth embodiment of the present invention, Referring to FIG. 8, a semiconductor device 1D may further include a blocking layer 200 disposed between wavelength conversion layers 181, 182, and 183 and between first to third light-emitting parts P1, P2, and P3. The blocking layer 200 may also be disposed on a first insulating layer 140.

The blocking layer 200 may block the emission of light emitted from the first to third light-emitting parts P1, P2, and P3 to the adjacent wavelength conversion layers 181, 182, and 183. As an example, the blocking layer 200 may prevent the light emitted from the first light-emitting part P1 from being incident on the second wavelength conversion layer 182. With such a configuration, the blocking layer 200 may prevent color mixing and superposition of the light.

The blocking layer 200 may include a metal. The blocking layer 200 may include a light reflective metal to reflect the light traveling to the adjacent wavelength conversion layers 181, 182, and 183. As an example, the metal may include, but is not limited to, Ag, Ni, Ti, or Al.

A width d3 of the blocking layer 200 may be 20 nm or more, and preferably, the width d3 of the blocking layer 200 may be in a range of 100 nm to 1000 nm. When the width d3 of the blocking layer 200 is less than 100 nm, it is difficult to fix the blocking layer 200, and thus the surface roughness may be increased. Further, when the width d3 of the blocking layer 200 is greater than 1000 nm, peeling may occur due to stress caused by weight or the like.

The blocking layer 200 may be formed by the deposition of a metal, but the present invention is not limited thereto.

The color filter layer 220 may include a plurality of color filters 221, 222, and 223 and black matrix 224. First to third color filters 221, 222, and 223 may be disposed in the color filter layer 220. As an example, the first color filter 221 may be a green filter, the second color filter 222 may be a red filter, and the third color filter 223 may be a blue filter.

A first intermediate layer 210 may be disposed between the color filter layer 220 and the wavelength conversion layers 181, 182, and 183 to perform the role of adhering them. The features described in FIG. 5 may be applied as they are to the color filter layer 220 and the first intermediate layer 210. Further, the second intermediate layer of FIG. 6 may be further disposed.

FIGS. 9A to 9D are views illustrating a method of manufacturing the semiconductor device according to the fourth embodiment.

Figure 9A:
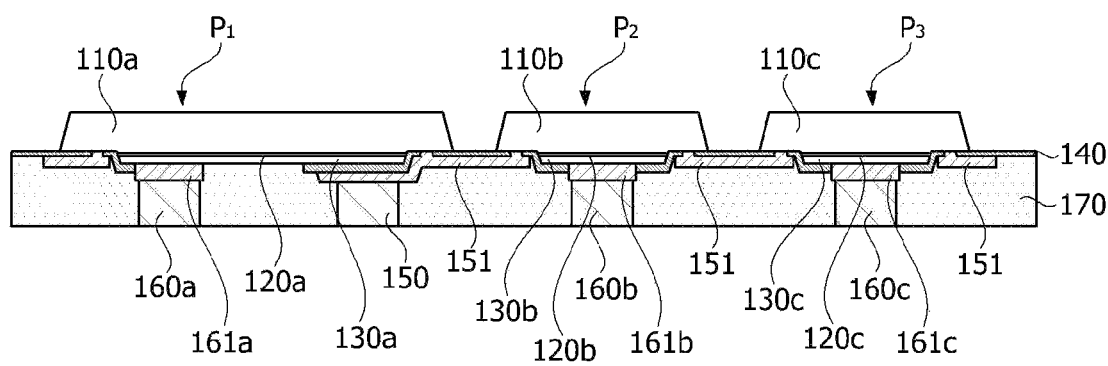
FIGS. 9A to 9D are views illustrating a method of manufacturing the semiconductor device according to the fourth embodiment.

The manufacturing process described with reference to FIGS. 7A to 7C may be applied as it is to the light-emitting device according to FIG. 9A. That is, after removing a substrate, a first conductive type semiconductor layer 110 may be separated into each part unit of light-emitting parts P1, P2, and P3. Accordingly, the first conductive type semiconductor layer 110 may be formed to have a smaller width in a direction opposite to a second conductive type semiconductor layer 130 during a mesa etching process.

Figure 9B:
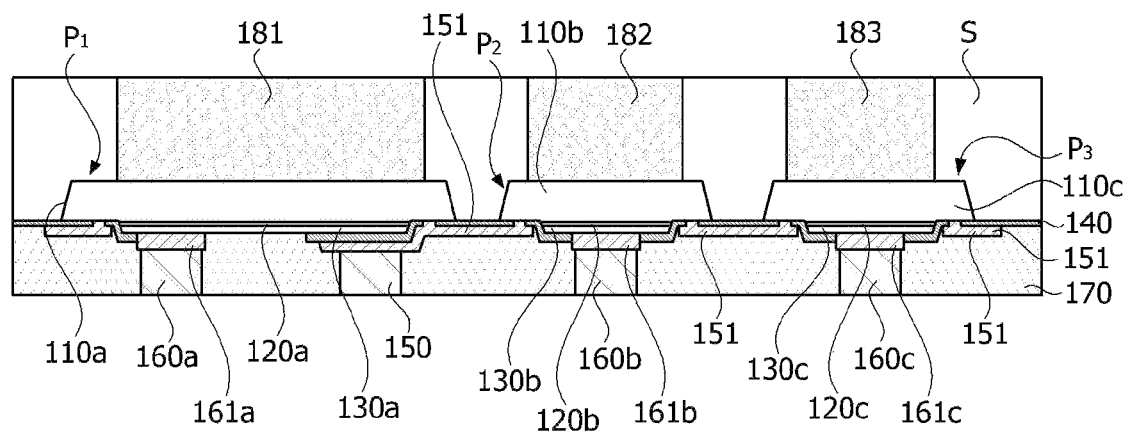
Figure 9B:
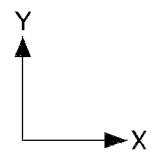

Referring to FIG. 9B, wavelength conversion layers 181, 182, and 183 and photosensitive layers S may be formed on the first conductive type semiconductor layer 110. Here, the wavelength conversion layers 181, 182, and 183 may be formed first, and then the photosensitive layers S may be formed, but the present invention is not necessarily limited thereto, and the photosensitive layers S are formed first to form through holes and the wavelength conversion layers 181, 182, and 183 may be formed in the through holes.

Figure 9C:
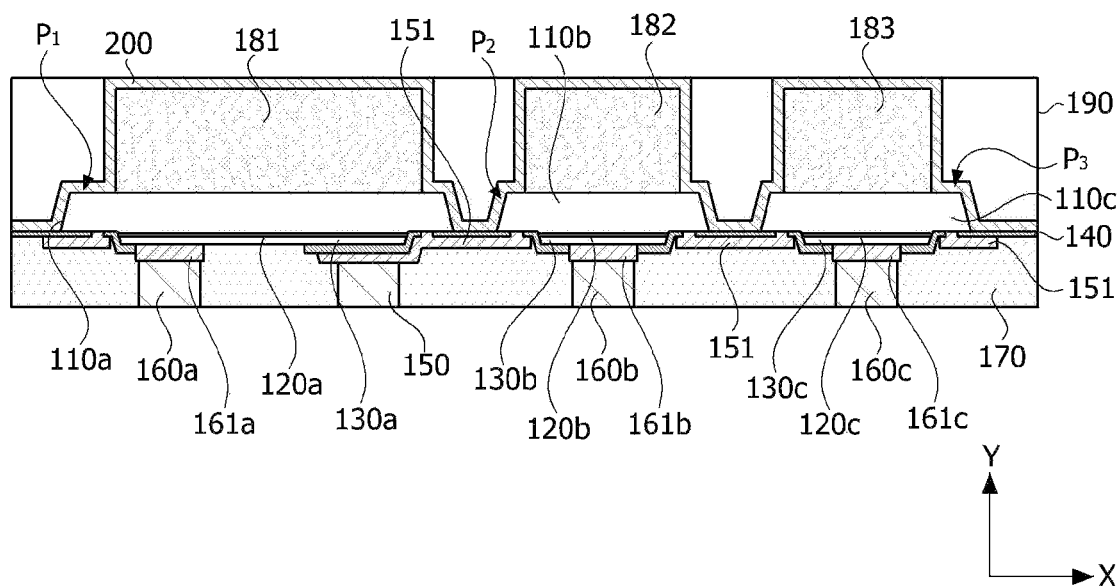

Referring to FIG. 9C, a blocking layer 200 may be formed between the wavelength conversion layers 181, 182, and 183, the first to third light-emitting parts P1, P2, and P3, and a first electrode 151, and partitions 190. As an example, the blocking layer 200 may be deposited after removing the photosensitive layers S.

The blocking layer 200 may be formed using methods such as a metal organic chemical vapor deposition (MOCVD) method, a chemical vapor deposition (CVD) method, a sputtering method, or the like, but the present invention is not limited thereto.

The blocking layer 200 may be formed, and then the partition 190 may be formed on the blocking layer 200.

Figure 9D:
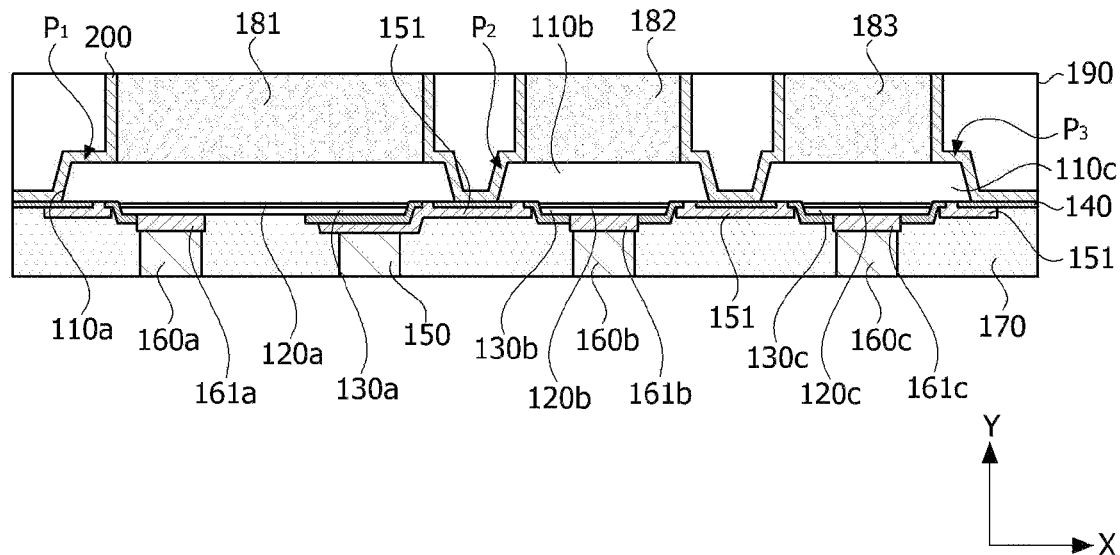

Referring to FIG. 9D, parts of the wavelength conversion layers 181, 182, and 183, the partitions 190, and the blocking layer 200 may be removed such that an upper surface of each of the wavelength conversion layers 181, 182, and 183, the partitions 190, and the blocking layer 200 is exposed. A leveling or polishing process may be applied to the removing method, but the present invention is not necessarily limited thereto.

Figure 10:
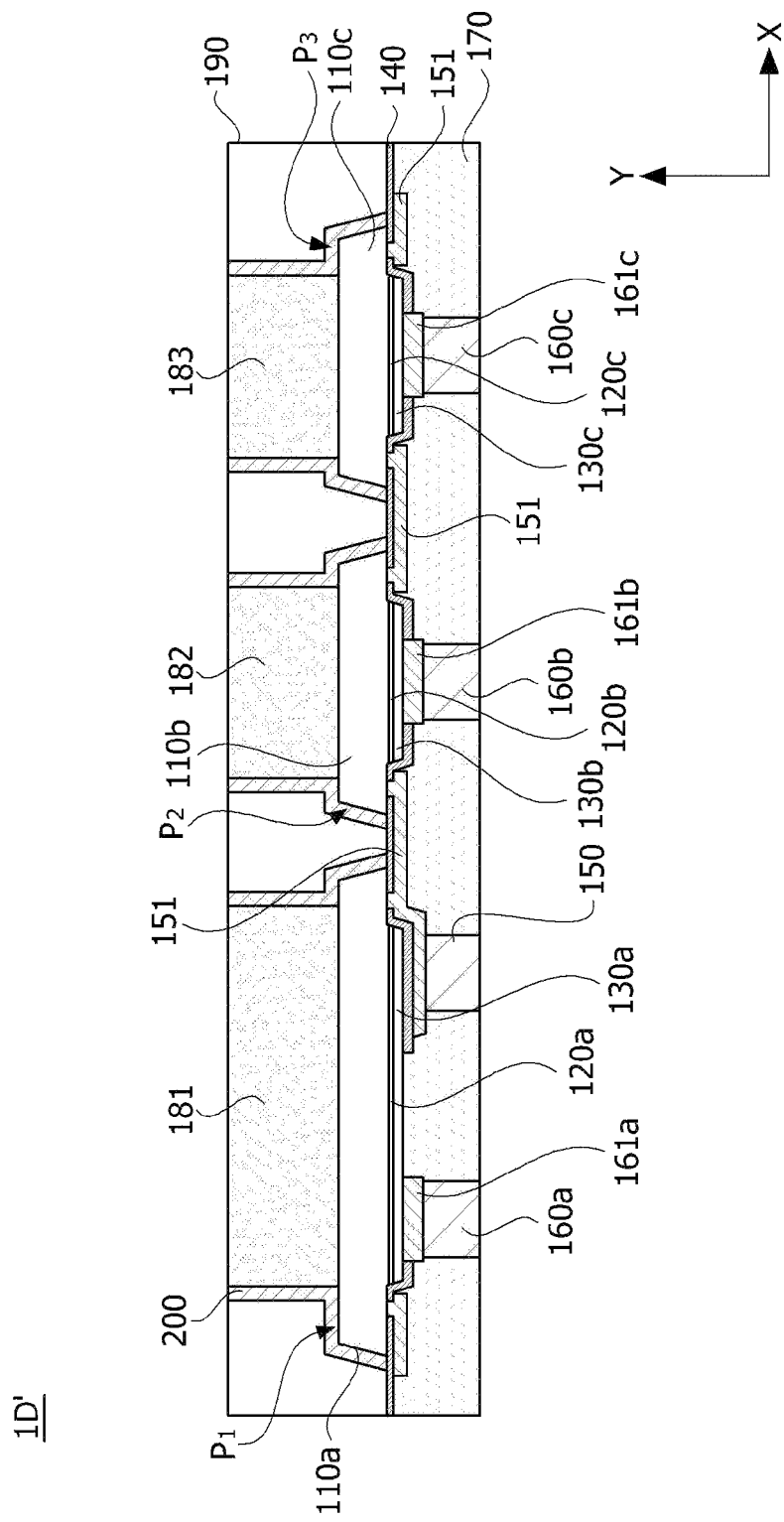
FIG. 10 is a cross-sectional view of a modified example of the semiconductor device according to the fourth embodiment shown in FIG. 8.

FIG. 10 is a cross-sectional view of a modified example of the semiconductor device according to the fourth embodiment shown in FIG. 8.

Referring to FIG. 10, a blocking layer 200 of a semiconductor device 1D' is formed between wavelength conversion layers 181, 182, and 183 and first to third light-emitting parts P1, P2, and P3, and partitions 190. Here, a first insulating layer 140 may be exposed through the blocking layer 200.

The blocking layer 200 may block the emission of light emitted from the first to third light-emitting parts P1, P2, and P3 to the adjacent wavelength conversion layers 181, 182, and 183. With such a configuration, the blocking layer 200 may prevent color mixing and superposition of the light. The above description may be equally applied to the blocking layers 200

Figure 11:
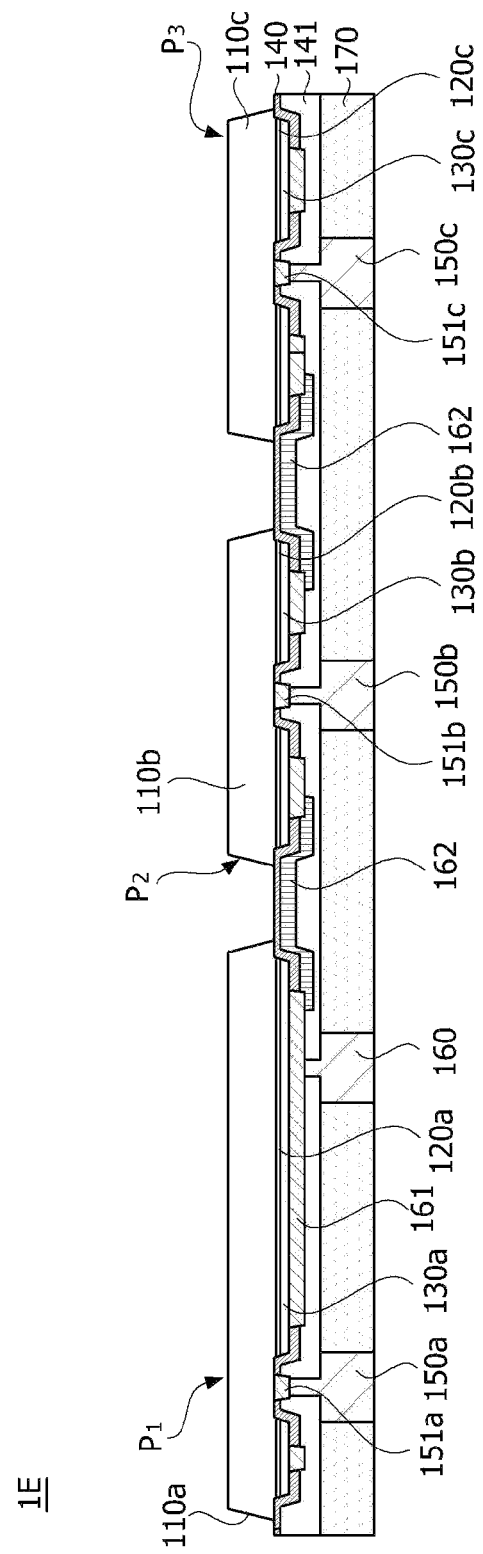
FIG. 11 is a cross-sectional view of a semiconductor device according to a fifth embodiment of the present invention.

FIG. 11 is a cross-sectional view of a semiconductor device according to a fifth embodiment of the present invention, Referring to FIG. 11, a semiconductor device 1E may include first to third light-emitting parts P1, P2, and P3, first bump electrodes 150*a*, 150*b*, and 150*c* electrically connected to first conductive type semiconductor layers 110*a*, 110*b*, and 110*c* spaced apart from each other, respectively, a second electrode 162 electrically connecting separated second conductive type semiconductor layers 130*a*, 130*b*, and 130*c*, and a second bump electrode 160 electrically connected to the second electrode 162.

In the semiconductor device 1E according to the embodiment, the first bump electrodes 150*a*, 150*b*, and 150*c* are electrically connected to the first conductive type semiconductor layers 110*a*, 110*b*, and 110*c*, respectively, and the second bump electrode 160 may be electrically connected to the second conductive type semiconductor layers 130*a*, 130*b*, and 130*c* through the second electrode 162.

The second electrode 162 may be disposed between the second conductive type semiconductor layers 130*a*, 130*b*, and 130*c* spaced apart from each other in the first to third light-emitting parts P1, P2, and P3. Further, the second electrode 162 may electrically connect the separated second conductive type semiconductor layers 130*a*, 130*b*, and 130*c* to each other.

Further, a first insulating layer 140 may be disposed below the first to third light-emitting parts P1, P2, and P3. In addition, reflective electrodes 161 may be disposed below the second conductive type semiconductor layers 130*a*, 130*b*, and 130*c*.

As an example, first electrodes 151*a*, 151*b*, and 151*c* may be disposed between the first conductive type semiconductor layers 110*a*, 110*b*, and 110*c* of the first to third light-emitting parts P1, P2, and P3, and the first bump electrodes 150*a*, 150*b*, and 150*c*, respectively. The reflective electrode 161 may be formed of a material having a high reflectance such as Ag, Ni, Al, Rh, Pd, Ir, Ru, Mg, Zn, Pt, Au, or Hf, or may be formed as a single layer or a multilayer by mixing the material having a high reflectance and a conductive material such as IZO, IZTO, IAZO, IGZO, IGTO, AZO, or ATO, but the present invention is not limited thereto.

In addition, the second electrode 162 may be disposed between the reflective electrodes 161 to electrically connect the second conductive type semiconductor layers 130*a*, 130*b*, and 130*c* to the second bump electrode 160. The second electrode 162 may serve as a common electrode configured to apply power to the first to third light-emitting parts P1, P2, and P3.

Referring again to FIG. 11, the first insulating layer 140 may be disposed to cover lower portions of the first to third light-emitting parts P1, P2, and P3. A second insulating layer 141 may cover a part of the first electrodes 151*a*, 151*b*, and 151*c*, a part of the reflective electrodes 161, and the entire second electrode 162.

The first insulating layer 140 and the second insulating layer 141 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but the present invention is not limited thereto.

The first insulating layer 140 may be a DBR having a multi-layer structure including a Si oxide or a Ti compound. However, the present invention is not necessarily limited thereto, and the first insulating layer 140 may include various reflection structures.

A support layer 170 may be disposed below the plurality of light emitting parts P1, P2, and P3 to support the plurality of light emitting parts P1, P2, and P3 and the second electrode 162. Further, the support layer 170 has low light transmittance and may function as a light reflective layer and/or a light absorption layer.

The support layer 170 may have a structure in which reflective particles are dispersed in a base material. The base material may be at least one of a light-transmitting epoxy resin, a silicone resin, a polyimide resin, a urea resin, and an acrylic resin. As an example, a polymer resin may be a silicone resin. The reflective particles may include inorganic particles such as $TiO_2$ or $SiO_2$. However, the present invention is not necessarily limited thereto, and the support layer may be an EMC resin or an SMC resin.

The support layer 170 may include 10 to 50 wt %, or 15 to 30 wt % of inorganic particles. When the content of the particles is less than 10 wt %, it is difficult to control the transmittance to 20% or less, and when the content is greater than 50 wt %, the content of the inorganic particles is great, and thus cracks may occur.

The support layer 170 may have a CTE of 50 ppm/° C. or less. Accordingly, when the thickness of the support layer 170 is 70 μm or more, the transmittance of the support layer 170 may be 20% or less. As a result, light generated in the first to third light-emitting parts P1, P2, and P3 may be reflected at the support layer 170 toward upper portions of the first conductive type semiconductor layers 110*a*, 110*b*, and 110*c*. Thus, the semiconductor device according to one embodiment may provide improved light emission efficiency.

The first bump electrodes 150*a*, 150*b*, and 150*c* may be electrically connected to the first electrodes 151*a*, 151*b*, and 151*c* through the support layer 170.

The second bump electrode 160 may be electrically connected to the reflective electrode 161 through the support layer 170. The reflective electrodes 161 may be electrically connected to each other by the second electrode 162. However, the present invention is not limited thereto.

Further, the second bump electrode 160 may be electrically connected to the second conductive type semiconductor layers 130a, 130b, and 130c of the first to third light-emitting parts P1, P2, and P3 through the reflective electrodes 161 and the second electrode 162.

Figure 12:
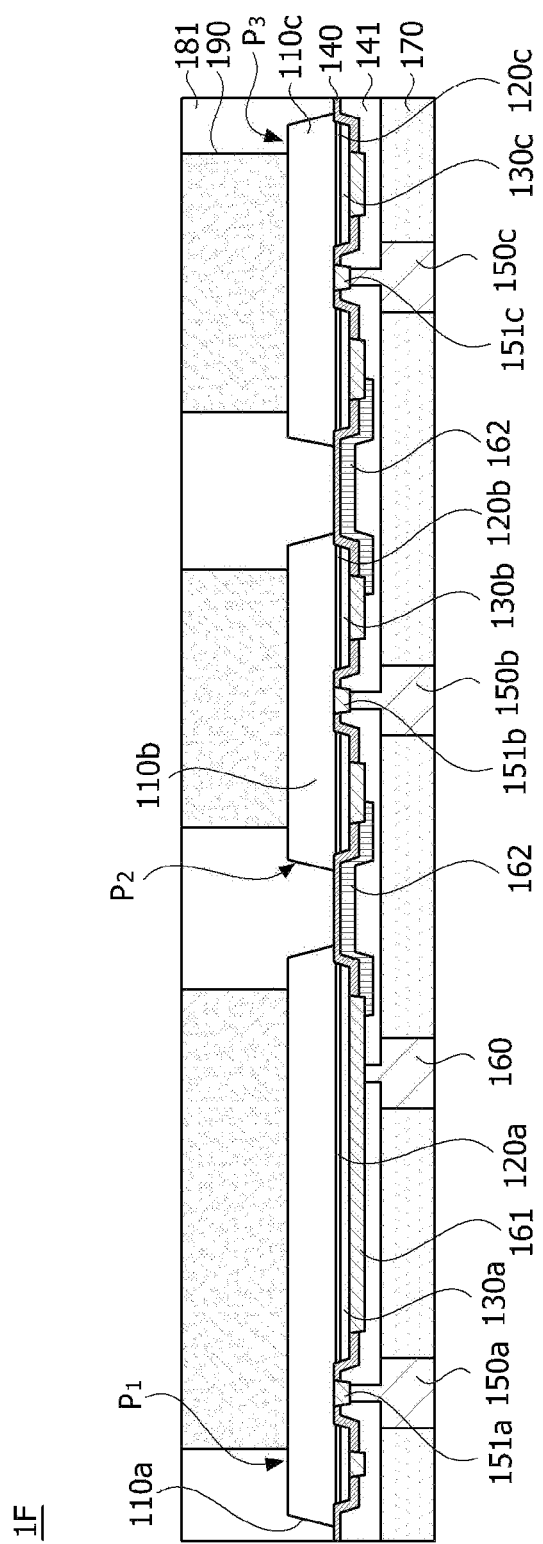
FIG. 12 is a cross-sectional view of a semiconductor device according to a sixth embodiment of the present invention.
Figure 13:
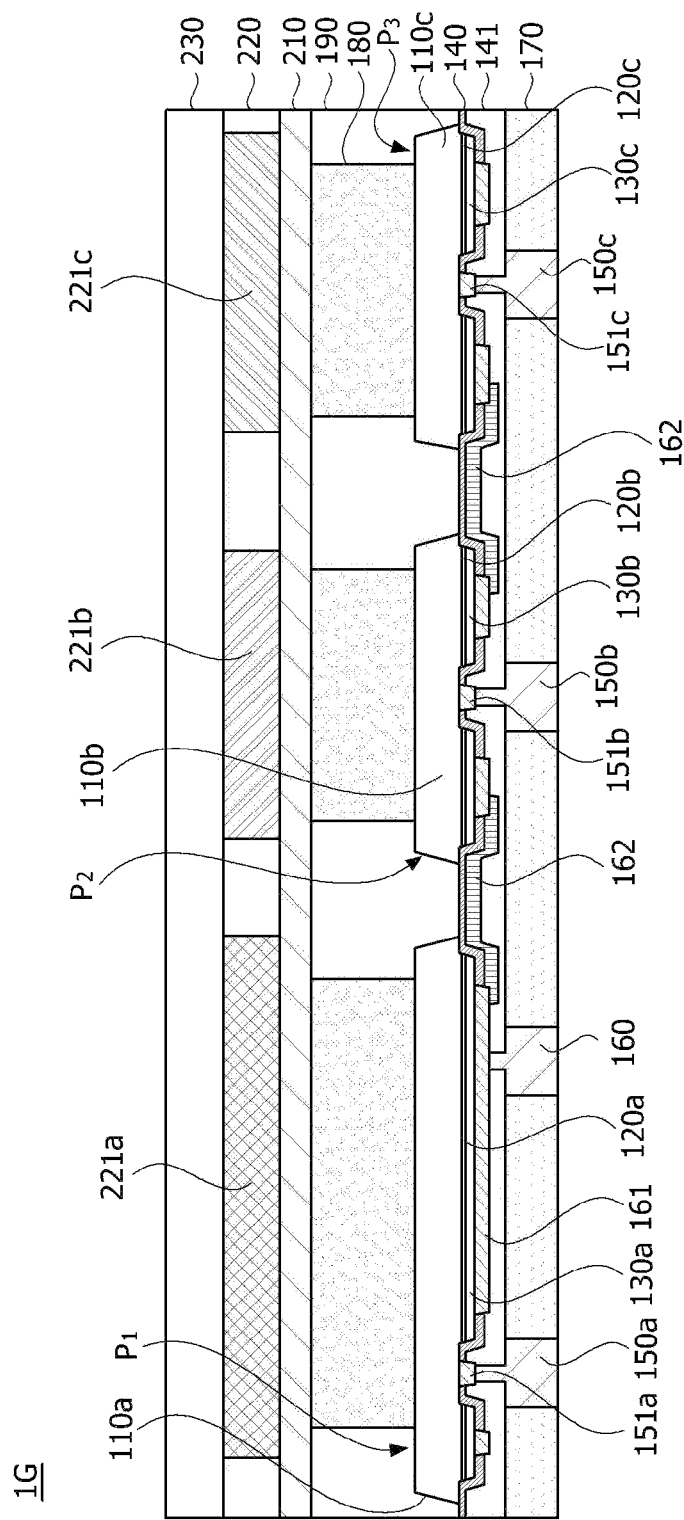
FIG. 13 is a cross-sectional view of a semiconductor device according to a seventh embodiment of the present invention.

FIG. 12 is a cross-sectional view of a semiconductor device according to a sixth embodiment of the present invention, and FIG. 13 is a cross-sectional view of a semiconductor device according to a seventh embodiment of the present invention.

Referring to FIG. 12, a semiconductor device 1F according to the embodiment may further include wavelength conversion layers 181, 182, and 183 and partitions 190 disposed on first to third light-emitting parts P1, P2, and P3.

The wavelength conversion layers 181, 182, and 183 may convert the wavelengths of light emitted from the first to third light-emitting parts P1, P2, and P3.

As an example, a first wavelength conversion layer 181 may convert light emitted from the first light-emitting part P1 into green light, a second wavelength conversion layer 182 may convert light emitted from the second light-emitting part P2 into red light, and a third wavelength conversion layer 183 may convert light emitted from the third light-emitting part P3 into blue light. When the third light-emitting part P3 emits the blue light, the third wavelength conversion layer 183 may not change the wavelength.

However, the present invention is not necessarily limited thereto, and the first to third wavelength conversion layers 181, 182, and 183 may absorb light of a blue (B) wavelength band emitted from the first to third light-emitting parts P1, P2, and P3 and convert the light into light of a white (W) wavelength band.

The wavelength conversion layers 181, 182, and 183 may have a structure in which wavelength conversion particles are dispersed in a polymer resin selected from a transmitting epoxy resin, a silicone resin, a polyimide resin, a urea resin, an acrylic resin, and the like, but the present invention is not limited thereto.

The wavelength conversion particles may include at least one of a phosphor and a QD. Hereinafter, the wavelength conversion particles will be described as a phosphor.

The phosphor may include one fluorescent material among a YAG-based fluorescent material, a TAG-based fluorescent material, a silicate-based fluorescent material, a sulfide-based fluorescent material, and a nitride-based fluorescent material, but the embodiment is not limited to the type of the phosphor.

As an example, the YAG-based and TAG-based fluorescent materials may be selected from among (Y, Tb, Lu, Sc, La, Gd, Sm)3(Al, Ga, In, Si, Fe)5(O, S)12:Ce, and the silicate-based fluorescent material may be selected from among (Sr, Ba, Ca, Mg)2SiO4:(Eu, F, Cl). In addition, the sulfide-based fluorescent material may be selected from among (Ca, Sr)S:Eu and (Sr,Ca,Ba)(Al,Ga)2S4:Eu, and the nitride-based phosphor may be (Sr, Ca, Si, Al, O)N:Eu (for example, CaAlSiN4:Eu SiAlON:Eu) or (Cax,My)(Si,Al)12(O,N)16 which is a Ca-α SiAlON:Eu-based phosphor. In this case, M is at least one material among Eu, Tb, Yb, and Er, and may be selected from among phosphor components satisfying 0.05<(x+y)<0.3, 0.02<x<0.27 and 0.03<y<0.3.

The wavelength conversion layers 181, 182, and 183 described above may be separated into regions overlapping the first to third light-emitting parts P1, P2, and P3 in a vertical direction by the partitions 190. The partitions 190 may be disposed between the wavelength conversion layers 181, 182, and 183 and between the light-emitting parts P1, P2, and P3. The partitions 190 may include a light absorbing material such as carbon black or graphite, but may also include a reflective material that reflects the light.

The partition 190 may be a structure in which reflective particles are dispersed in a base material. The base material may be at least one of an epoxy resin, a silicone resin, a polyimide resin, a urea resin, and an acrylic resin. As an example, the polymer resin may be a silicone resin. The reflective particles may include inorganic particles such as TiO2 or SiO2, but the present invention is not limited thereto.

The partition 190 may include 20 wt % or more of the inorganic particles. As an example, the inorganic particles in the partition may be in a range of 20 wt % to 70 wt %. When the inorganic particles are included in an amount of less than 20 wt %, there is a problem in that reflectance of the partition 190 is lowered and thus color purity is lowered. For example, when only the first light-emitting part P1 is turned on to emit green light, a portion of the light emitted from the first light-emitting part P1 may pass through the partition 190 and may be converted into red light by the second wavelength conversion layer 182. As a result, the color purity may be lowered. When the inorganic particles exceed 70 wt %, cracks may occur in the partition 190.

The partition 190 may include a first region disposed between the wavelength conversion layers 181, 182, and 183 and a second region disposed between the first to third light-emitting parts P1, P2, and P3. The description of the partition 190 may be applied in the same manner as described above.

Referring to FIG. 13, a semiconductor device 1G according to the embodiment may include a color filter layer 220 disposed above wavelength conversion layers 181, 182, and 183 and partition 190

First to third color filters 221, 222, and 223 may be disposed in the color filter layer 220. As an example, the first color filter 221 may be a green filter, the second color filter 222 may be a red filter, and the third color filter 223 may be a blue filter.

The color filter layer 220 may be formed by mixing green/red/blue pigments with an acrylic resin such as methylmethacrylate-butadiene-styrene (MBS). As an example, the color filter layer 220 may be formed by coating, exposing, developing, and curing (firing) a pigment composition dispersed in a photoresist.

The color filter layer 220 may improve the color purity of light converted by the wavelength conversion layers 181, 182, and 183. As an example, the first color filter 221 may block light other than green light converted by a first wavelength conversion layer 181 to improve the color purity of the green light.

Further, when the wavelength conversion layers 181, 182, and 183 convert light of the first to third light-emitting parts P1, P2, and P3 into white light, the color filter layer 220 may separate light of a white (W) wavelength band into light of blue (B), green (G), and red (R) wavelength bands.

The color filter layer 220 may include black matrix 224 disposed between the first to third color filters 221, 222, and 223.

A first intermediate layer 210 may be disposed between the color filter layer 220 and the wavelength conversion layers 181, 182, and 183. As described above, the color filter layer 220 may use an acrylic resin as a main raw material, and the partitions and the wavelength conversion layers 181, 182, and 183 may use a silicone resin as a main raw material.

However, since the acrylic resin and the silicone resin have a poor adhesive property, it may not be easy to form the color filter layer 220 directly on the wavelength conversion layers 181, 182, and 183.

The first intermediate layer 210 may include an oxide or a nitride as an inorganic material. As an example, the first intermediate layer 210 may include ITO, ZnO, AZO, or SiO2. However, the present invention is not necessarily limited thereto, and any material having excellent adhesion to both the acrylic resin and the silicone resin may be selected for the first intermediate layer 210.

A thickness of the first intermediate layer 210 may be in a range of 5 nm to 1000 nm, or 40 nm to 200 nm. When the thickness is less than 5 nm, it is difficult to prevent the acrylic resin from diffusing into a phosphor, and when the thickness is more than 1000 nm, there is a problem in that transmittance becomes smaller than 70% and thus luminous flux decreases. Although not shown in the drawing, a second intermediate layer may be disposed between the first intermediate layer 210 and the wavelength conversion layers 181, 182, and 183.

An encapsulation layer 230 may be disposed on the color filter layer 220. The encapsulation layer 230 may protect the plurality of light emitting parts P1, P2, and P3, the wavelength conversion layers 181, 182, and 183, and the partitions 190 by being disposed on the color filter layer 220 so as to cover pixels and the semiconductor device.

The encapsulation layer 230 is made of a heat- and/or light-curable resin and coated on the color filter layer 220 in a liquid state, and may be cured by a curing process using heat and/or light. Here, the encapsulation layer 230 also serves to buffer external pressing.

Figure 14:
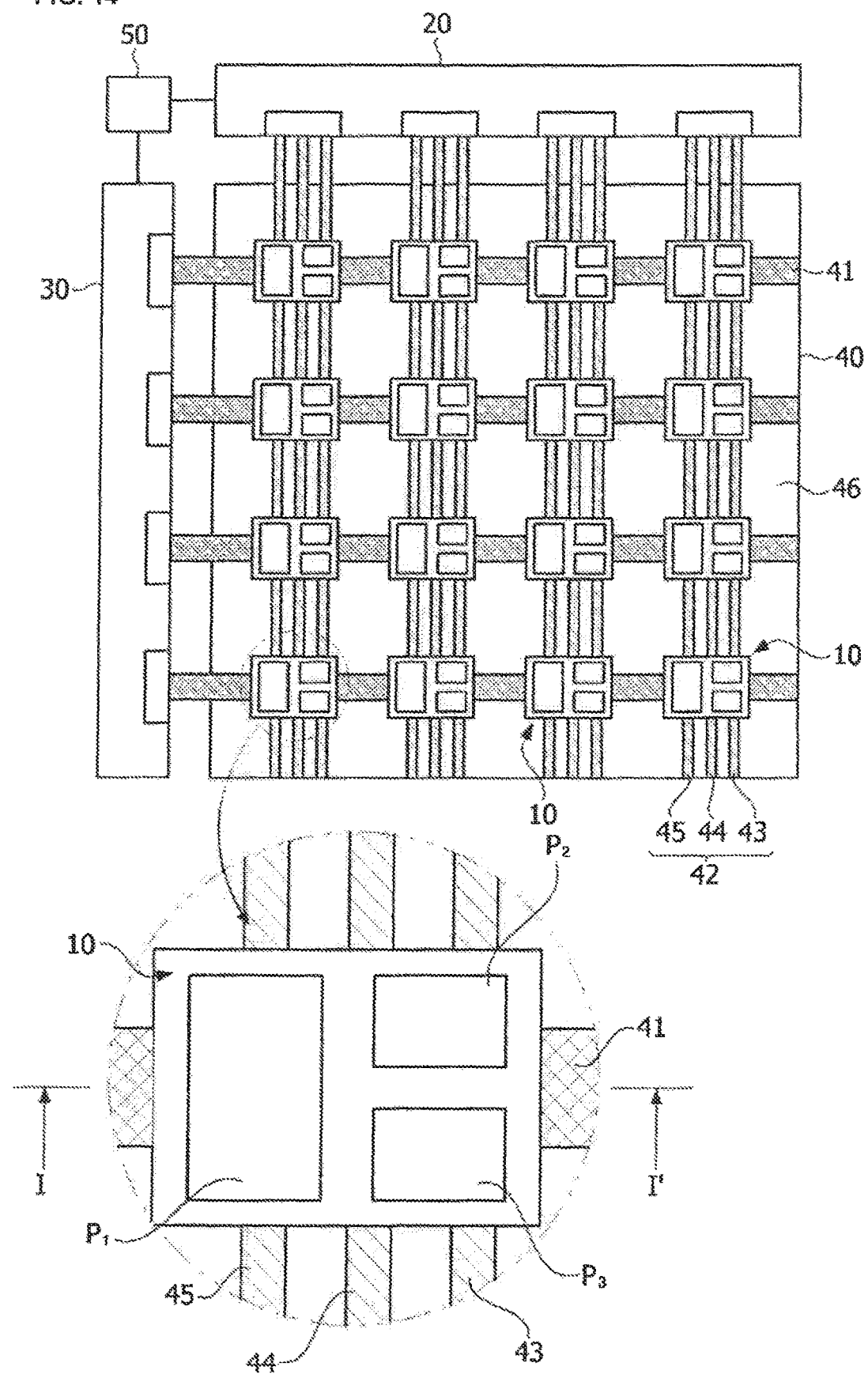
FIG. 14 is a plan view of a display device according to one embodiment of the present invention.
Figure 15:
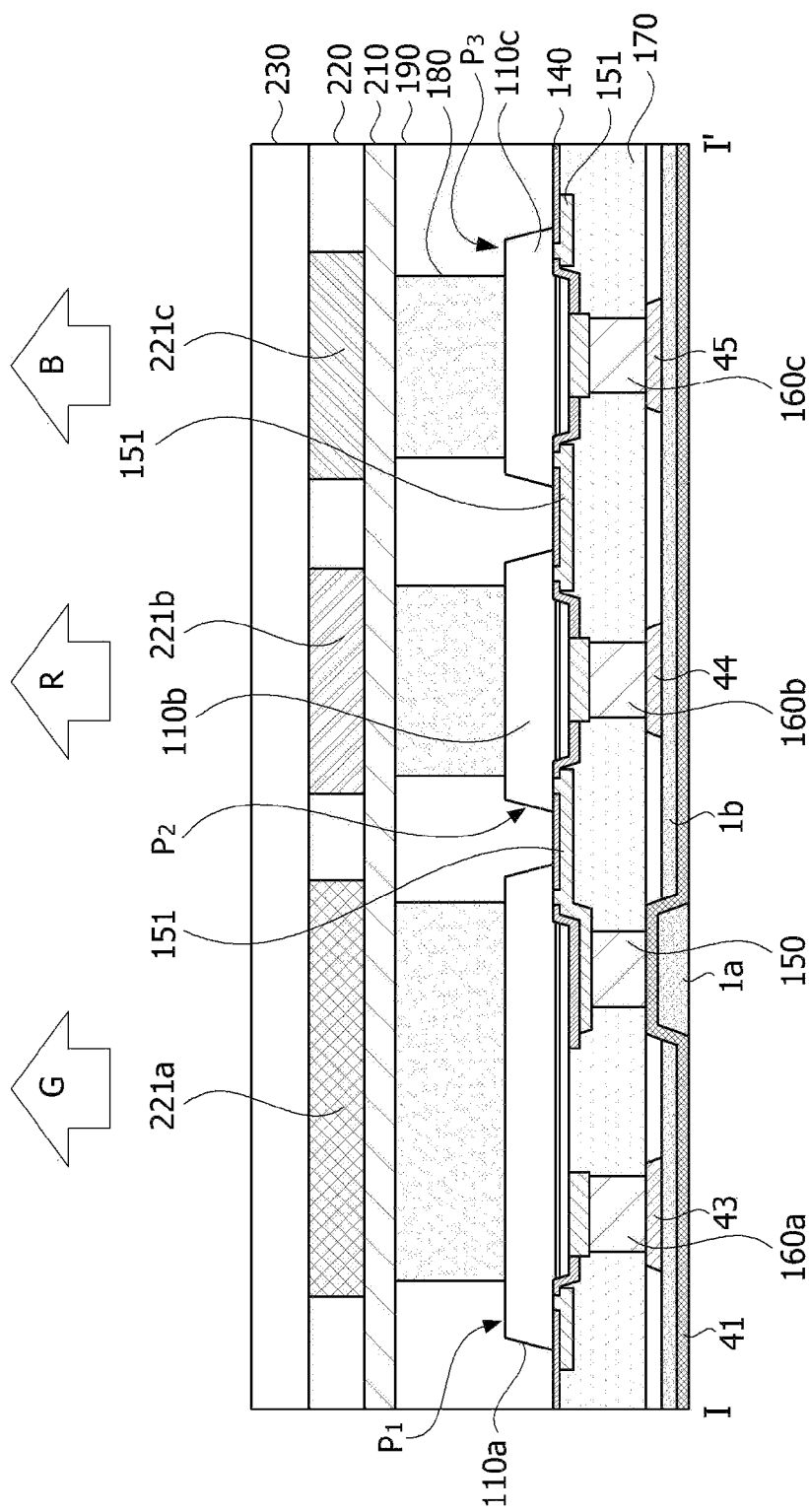
FIG. 15 is a view illustrating a state in which a semiconductor device and a circuit board are electrically connected to each other.

FIG. 14 is a plan view of a display device according to one embodiment of the present invention, and FIG. 15 is a view illustrating a state in which a semiconductor device and a circuit board are electrically connected to each other.

Referring to FIGS. 14 and 15, the display device may include a panel 40 having a plurality of pixel regions defined as regions in which common wirings 41 intersect driving wirings 42, semiconductor devices disposed in each pixel region, a first driver 30 configured to apply driving signals to the common wirings 41, a second driver 20 configured to apply driving signals to the driving wirings 42, and a controller 50 configured to control the first driver 30 and the second driver 20.

Second partitions 46 disposed on the panel 40 are disposed between the semiconductor devices disposed in each pixel region to support the semiconductor devices, the common wirings 41, the driving wirings 42, and the like. Thus, even when the panel 40 is enlarged to have a large area, disconnection of the common wiring 41 and the driving wiring 42 may be prevented. The second partitions 46 may be formed of a material such as carbon black, graphite, and the like to prevent light leakage between adjacent pixel regions, but the present invention is not limited thereto.

The common wiring 41 may be electrically connected to a first electrode 150 of the semiconductor device. In addition, first, second, and third driving wirings 43, 44, and 45 may be electrically connected to second electrodes 160a, 160b, and 160c of first, second, and third light-emitting parts P1, P2, and P3, respectively.

Since both the first electrode 150 and the second electrodes 160a, 160b, and 160c are exposed in a direction in which second conductive type semiconductor layers 130a, 130b, and 130c of the semiconductor device are disposed with respect to active layers 120a, 120b, and 120c, the common wiring 41 and the driving wiring 42 may have a structure separated from each other with at least one insulating film interposed therebetween, but the present invention is not limited thereto. In the embodiment, first and second insulating films 1a and 1b are illustrated.

The semiconductor device may be disposed for each pixel region of the panel 40. One semiconductor device may function as a pixel of the display device. In addition, the first to third light-emitting parts P1, P2, and P3 of the semiconductor device may function as first, second, and third subpixels. For example, the first light-emitting part P1 may function as a blue subpixel, the second light-emitting part P2 may function as a green subpixel, and the third light-emitting part P3 may function as a red subpixel. Accordingly, white light may be realized by mixing light of blue, green, and red wavelength bands emitted from one semiconductor device.

Further, the semiconductor devices may be disposed on a substrate in a chip scale package (CSP).

The controller 50 may output control signals to the first and second drivers 30 and 20 such that power is selectively applied to the common wirings 41 and the driving wirings 42. Accordingly, the first to third light-emitting parts P1, P2, and P3 of the semiconductor device may be controlled individually.

In a typical display device, light-emitting devices may be individually disposed on each subpixel of a pixel, or a semiconductor device including two or more light-emitting devices packaged through an additional packaging process such as die bonding and wire bonding may be disposed on a pixel. Accordingly, since a packaging area should be taken into consideration in the typical display device, the area of the actual light-emitting region of the entire area of a panel becomes narrow, and light emission efficiency is low.

On the other hand, in the display device of the embodiments, a chip-level semiconductor device is disposed in the pixel region, and the first, second, and third light-emitting parts P1, P2, and P3 of the semiconductor device may function as first to third subpixels of R, G, and B. Thus, there is no need to package the first to third light-emitting parts P1, P2, and P3 functioning as the first to third subpixels, using an additional process such as die bonding and wire bonding. Accordingly, since an area for performing the wire bonding or the like may be removed, widths between the first to third light-emitting parts P1, P2, and P3 of the semiconductor device may be reduced. That is, pitch widths of the subpixels and the pixel regions are reduced, and thus pixel density and resolution of the display device may be improved.

In particular, since the first electrode 150 and the second electrodes 160a, 160b, and 160c vertically overlap the plurality of light emitting parts P1, P2, and P3, the semiconductor device of the embodiments does not need to secure the above-described bonding regions. Accordingly, the light emission efficiency may be high, and the widths between the first to third light-emitting parts P1, P2, and P3 are reduced as described above, and thus the size of the semiconductor device may be reduced.

Accordingly, the display device of the embodiments including the semiconductor device of the embodiments has no limitation in implementing a standard definition (SD) resolution (760×480), a high definition (HD) resolution (1180×720), a full HD (FHD) resolution (1920×1080), and an ultra HD (UH) resolution (3480×2160) or a UHD or higher resolution (for example: 4K (K=1000), 8K, or the like).

Furthermore, the display device of the embodiments may also be applied to an electric signboard or TV with a diagonal size of 100 inches or more. This is because, as described above, the semiconductor device according to the embodiments functions as each pixel and thus may have low power consumption and a long lifespan, with low maintenance costs.

While the embodiments have been mainly described, they are only examples but do not limit the present invention, and it may be known to those skilled in the art that various modifications and applications, which have not been described above, may be made without departing from the essential properties of the embodiments. For example, the specific components according to the embodiments may be modified. In addition, it will be interpreted that differences related to the modifications and applications fall within the scope of the present invention defined by the appended claims.

The invention claimed is:

1. A semiconductor device comprising:
a plurality of light-emitting parts, wherein each of the light-emitting parts includes a first conductive type semiconductor layer, a second conductive type semiconductor layer, and an active layer disposed between the first conductive type semiconductor layer and the second conductive type semiconductor layer;
a plurality of wavelength conversion layers disposed on the plurality of light-emitting parts, respectively;
partitions disposed between the plurality of light-emitting parts and between the plurality of wavelength conversion layers;
a plurality of color filters disposed on the plurality of wavelength conversion layers, respectively;
a black matrix disposed between the plurality of color filters;
a first bump electrode commonly connected to the plurality of light-emitting parts;
a plurality of second bump electrodes electrically connected to the plurality of light-emitting parts, respectively;
a first electrode electrically connecting the first conductive type semiconductor layers of the plurality of light-emitting parts to each other; and
a first insulating layer covering lower portions of the plurality of light-emitting parts.

2. The semiconductor device of claim 1, wherein a width between the plurality of wavelength conversion layers is greater than the maximum width between the plurality of light-emitting parts.

3. The semiconductor device of claim 1, wherein the second conductive type semiconductor layer of the plurality of light-emitting parts has a width that increases toward the wavelength conversion layer.

4. The semiconductor device of claim 1, wherein the first electrode is electrically connected to the first conductive type semiconductor layer through the first insulating layer, and the first electrode is electrically connected to the first bump electrode.

5. The semiconductor device of claim 1, further comprising:
a plurality of first bump electrodes electrically connected to the plurality of light-emitting parts, respectively;
a second bump electrode commonly connected to the plurality of light-emitting parts; and
a second electrode electrically connecting the second conductive type semiconductor layers of the plurality of light-emitting parts to each other,
wherein the second electrode is electrically connected to the second bump electrode.

6. The semiconductor device of claim 5, further comprising:
a first insulating layer covering lower portions of the plurality of light-emitting parts; and
a plurality of reflective electrodes passing through the first insulating layer and disposed below the second conductive type semiconductor layers of the plurality of light-emitting parts, respectively,
wherein the second electrode electrically connects the plurality of reflective electrodes to each other.

7. The semiconductor device of claim 1, wherein a width between the neighboring wavelength conversion layers is in a range of 30 μm to 50 μm, and the partitions include reflective particles.

8. The semiconductor device of claim 1, further comprising a first intermediate layer disposed between the wavelength conversion layer and the color filter.

9. The semiconductor device of claim 1, wherein the partitions include reflective particles.

10. The semiconductor device of claim 8, wherein the wavelength conversion layer includes a silicone resin, the color filter includes an acrylic resin.

11. The semiconductor device of claim 8, wherein the first intermediate layer includes an oxide or a nitride.

12. The semiconductor device of claim 1, wherein the first conductive type semiconductor layer of the plurality of light-emitting parts has a width that narrows toward the wavelength conversion layer.

13. The semiconductor device of claim 1, wherein the active layer of the plurality of light-emitting parts has a width that increases toward the wavelength conversion layer.

14. The semiconductor device of claim 1, wherein a thickness of the black matrixis in a range of 5 μm to 55 μm.

15. A display device comprising a semiconductor device, wherein the semiconductor device comprises,
a plurality of light-emitting parts, wherein each of the light-emitting parts includes a first conductive type semiconductor layer, a second conductive type semiconductor layer, and an active layer disposed between the first conductive type semiconductor layer and the second conductive type semiconductor layer;
a plurality of wavelength conversion layers disposed on the plurality of light-emitting parts, respectively;
partitions disposed between the plurality of light-emitting parts and between the plurality of wavelength conversion layers;
a plurality of color filters disposed on the plurality of wavelength conversion layers, respectively;
a black matrix disposed between the plurality of color filters;
a first bump electrode commonly connected to the plurality of light-emitting parts;
a plurality of second bump electrodes electrically connected to the plurality of light-emitting parts, respectively;
a first electrode electrically connecting the first conductive type semiconductor layers of the plurality of light-emitting parts to each other; and
a first insulating layer covering lower portions of the plurality of light-emitting parts.

16. The display device of claim 15, wherein a width between the plurality of wavelength conversion layers is greater than the maximum width between the plurality of light-emitting parts.

17. The display device of claim 15, wherein the second conductive type semiconductor layer of the plurality of light-emitting parts has a width that increases toward the wavelength conversion layer.

18. The display device of claim 15, wherein the first electrode is electrically connected to the first conductive type semiconductor layer through the first insulating layer, and the first electrode is electrically connected to the first bump electrode.

19. The display device of claim 15, further comprising:
- a plurality of first bump electrodes electrically connected to the plurality of light-emitting parts, respectively;
- a second bump electrode commonly connected to the plurality of light-emitting parts; and
- a second electrode electrically connecting the second conductive type semiconductor layers of the plurality of light-emitting parts to each other, wherein the second electrode is electrically connected to the second bump electrode.

20. The display device of claim 15, wherein the first conductive type semiconductor layer of the plurality of light-emitting parts has a width that narrows toward the wavelength conversion layer.

* * * * *